(12) United States Patent
Okada et al.

(10) Patent No.: US 11,982,899 B2
(45) Date of Patent: May 14, 2024

(54) IMAGE PROCESSING DEVICE, IMAGING DEVICE, IMAGE PROCESSING METHOD, AND IMAGE PROCESSING PROGRAM

(71) Applicant: FUJIFILM Corporation, Tokyo (JP)

(72) Inventors: Kazuyoshi Okada, Saitama (JP); Yasunobu Kishine, Saitama (JP); Atsushi Kawanago, Saitama (JP); Yuya Hirakawa, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 14 days.

(21) Appl. No.: 17/862,407

(22) Filed: Jul. 12, 2022

(65) Prior Publication Data

US 2022/0365391 A1 Nov. 17, 2022

Related U.S. Application Data

(63) Continuation of application No. PCT/JP2021/002355, filed on Jan. 25, 2021.

(30) Foreign Application Priority Data

Jan. 31, 2020 (JP) .................................. 2020-015550

(51) Int. Cl.
*G02F 1/1335* (2006.01)
*G02B 5/30* (2006.01)
*H04N 23/55* (2023.01)

(52) U.S. Cl.
CPC ..... *G02F 1/133538* (2021.01); *G02B 5/3025* (2013.01); *H04N 23/55* (2023.01)

(58) Field of Classification Search
CPC ........ H04N 25/70; H04N 23/12; H04N 23/55; G02B 5/3025; G02B 3/0056;
(Continued)

(56) References Cited

U.S. PATENT DOCUMENTS 10,460,422 B2 10/2019 Kurita et al.
10,750,136 B2 8/2020 Kaizu et al.
(Continued)

FOREIGN PATENT DOCUMENTS

CN 110505422 A * 11/2019 ......... H01L 27/1461
JP 2016171368 9/2016
(Continued)

OTHER PUBLICATIONS

"International Search Report (Form PCT/ISA/210) of PCT/JP2021/002355," dated Apr. 13, 2021, with English translation thereof, pp. 1-5.
(Continued)

*Primary Examiner* — Hoan C Nguyen
(74) *Attorney, Agent, or Firm* — JCIPRNET

(57) ABSTRACT

Provided are an image processing device, an imaging element, an image processing method, and an image processing program that satisfactorily generate a plurality of polarized image data from polarized image data acquired from an imaging element. A processor (200B) of an image processing device (200) performs an acquisition process of acquiring first image data from an imaging element (100) in which four first-polarizers having different polarization directions are regularly provided on pixels arranged in a two-dimensional manner, a first polarized image data generation process of performing a demosaicing process on the first image data to generate four pieces of first polarized image data having different polarization directions, and a second polarized image data generation process of generating four or less pieces of second polarized image data by using the four pieces of first polarized image data and a relationship between the polarization directions of the four first-polarizers stored in the memory (200C).

12 Claims, 12 Drawing Sheets

(58) Field of Classification Search
CPC ......... G02F 1/133538; H01L 27/14627; H01L 27/14621
See application file for complete search history.

(56) References Cited

U.S. PATENT DOCUMENTS

| | | | |
|---|---|---|---|
| 2012/0212587 A1* | 8/2012 | Otani | H04N 13/225 348/E13.074 |
| 2014/0210695 A1* | 7/2014 | Lin | G09G 3/003 345/32 |
| 2016/0173834 A1* | 6/2016 | Bert | G02B 27/286 348/222.1 |
| 2016/0269694 A1 | 9/2016 | Masuda et al. | |
| 2017/0264868 A1 | 9/2017 | Masuda et al. | |
| 2018/0241445 A1* | 8/2018 | Li | H03M 1/26 |
| 2019/0116355 A1* | 4/2019 | Schmidt | G01S 7/486 |
| 2020/0162680 A1* | 5/2020 | Mitani | G03B 11/00 |

FOREIGN PATENT DOCUMENTS

| | | |
|---|---|---|
| WO | 2017081925 | 5/2017 |
| WO | 2018074064 | 4/2018 |

OTHER PUBLICATIONS

"Written Opinion of the International Searching Authority (Form PCT/ISA/237)" of PCT/JP2021/002355, dated Apr. 13, 2021, with English translation thereof, pp. 1-8.

* cited by examiner

IMAGE PROCESSING DEVICE, IMAGING DEVICE, IMAGE PROCESSING METHOD, AND IMAGE PROCESSING PROGRAM

CROSS-REFERENCE TO RELATED APPLICATIONS

The present application is a Continuation of PCT International Application No. PCT/JP2021/002355 filed on Jan. 25, 2021 claiming priority under 35 U.S.C § 119(a) to Japanese Patent Application No. 2020-015550 filed on Jan. 31, 2020. Each of the above applications is hereby expressly incorporated by reference, in its entirety, into the present application.

BACKGROUND OF THE INVENTION

1. Field of the Invention

The present invention relates to an image processing device, an imaging device, an image processing method, and an image processing program, and particularly relates to a technique of generating a plurality of polarized image data from polarized image data acquired from an imaging element.

2. Description of the Related Art

Imaging elements described in JP2016-171368A are disposed in an array and comprise a plurality of light receiving units (cells) that respectively detect light of a specific color and polarization angle. In the plurality of cells, both the color and the polarization angle to be detected are different between adjacent cells.

Specifically, the plurality of cells are provided with a polarizer (polarization filter) that transmits light having a polarization angle of 0°, 45°, 90°, or 135° and further provided with a color filter of any one of red, green, or blue (RGB).

This makes it possible to generate an RGB image (polarized image) for each polarization angle of 0°, 45°, 90°, or 135°.

Further, JP2016-171368A describes an image processing unit that performs demosaicing on a polarized RAW image to generate a plurality of polarized images having different polarization angles. The demosaicing is a process of generating a polarized image for each of identical polarization angles based on a pixel group captured by an imaging element.

SUMMARY OF THE INVENTION

One embodiment according to the technique of the present disclosure provides an image processing device, an imaging device, an image processing method, and an image processing program that satisfactorily generate a plurality of polarized image data from polarized image data acquired from an imaging element.

An image processing device according to a first aspect of the present invention comprises a processor and a memory that stores a relationship between polarization directions. The processor performs image processing and performs an acquisition process of acquiring first image data from an imaging element in which n first-polarizers having different polarization directions are regularly provided in a plurality of pixels consisting of photoelectric conversion elements arranged in a two-dimensional manner, assuming that n is an integer of 4 or more, a first polarized image data generation process of performing a demosaicing process on the first image data to generate n pieces of first polarized image data according to the different polarization directions, and a second polarized image data generation process of generating n or less pieces of second polarized image data by using the n pieces of first polarized image data and the relationship between the polarization directions stored in the memory.

In the image processing device according to a second aspect of the present invention, the relationship between the polarization directions is preferably a relationship between characteristics of the n first-polarizers and a physical quantity of a pixel corresponding to the first-polarizer.

In the image processing device according to a third aspect of the present invention, in a case where the n is 4, assuming that four pieces of polarized image data separated from the first image data for each polarization direction are $I_1$, $I_2$, $I_3$, and $I_4$, respectively, the processor preferably performs calculation of the following equation $$\begin{Bmatrix} I_1 \\ I_2 \\ I_3 \\ I_4 \end{Bmatrix} * K \qquad \text{[Formula 1]}$$

however, $$K = k \otimes k$$

$$k = \begin{Bmatrix} 0.125a \\ 0 \\ 0.5 - 0.125a \\ 1 \\ 0.5 - 0.125a \\ 0 \\ 0.125a \end{Bmatrix}$$

where a is a parameter, to generate four pieces of first polarized image data subjected to the demosaicing process.

In the image processing device according to a fourth aspect of the present invention, in a case where the n is 4, the memory preferably stores, as the relationship between the polarization directions of the n first-polarizers, the following matrix $$\begin{bmatrix} l_1 & 1 + l_1 \dfrac{c_1}{c_0} & l_1 \dfrac{c_2}{c_0} & l_1 \dfrac{c_3}{c_0} \\ l_2 & l_2 \dfrac{c_1}{c_0} & 1 + l_2 \dfrac{c_2}{c_0} & l_2 \dfrac{c_3}{c_0} \\ l_3 & l_3 \dfrac{c_1}{c_0} & l_3 \dfrac{c_2}{c_0} & 1 + l_3 \dfrac{c_3}{c_0} \end{bmatrix} \qquad \text{[Formula 2]}$$

where $l_1$ to $l_3$ and $c_0$ to $c_3$ are coefficients, and assuming that a first-pixel value that is originally present at each pixel position of the n pieces of first polarized image data is $x_0$ and three second-pixel values generated by the demosaicing process at the pixel position are $x_{1demo}$, $x_{2demo}$, and $x_{3demo}$, respectively, the processor preferably calculates three pixel values ($x_{1r}$, $x_{2r}$, and $x_{3r}$) generated at the pixel position for generating four or less pieces of second polarized image data by the following equation $$\begin{Bmatrix} x_{1r} \\ x_2 \\ x_{3r} \end{Bmatrix} = \begin{bmatrix} l_i & 1+l_1\frac{c_1}{c_0} & l_1\frac{c_2}{c_0} & l_1\frac{c_3}{c_0} \\ l_2 & l_2\frac{c_1}{c_0} & 1+l_2\frac{c_2}{c_0} & l_2\frac{c_3}{c_0} \\ l_3 & l_3\frac{c_1}{c_0} & l_3\frac{c_2}{c_0} & 1+l_3\frac{c_3}{c_0} \end{bmatrix} \begin{Bmatrix} x_0 \\ x_{1demo} \\ x_{2demo} \\ x_{3demo} \end{Bmatrix}.$$ [Formula 3]

In the image processing device according to a fifth aspect of the present invention, assuming that four pieces of polarization information of adjacent pixels obtained in a case where non-polarized light having a uniform light amount distribution is incident on the imaging element are $x_0$ to $x_3$, the coefficients $c_0$ to $c_3$ and the pieces of polarization information $x_0$ to $x_3$ satisfy the following equation $$\sum_{i=0}^{3} c_i x_i = 0.$$ [Formula 4]

As an example, $x_i$ is a brightness value of light.

In the image processing device according to a sixth aspect of the present invention, assuming that a parameter i is set to 1 to 3, the coefficients $l_1$, $l_2$, and $l_3$ in a matrix represented by the [Formula 2] are represented by li, and the coefficients $c_1$, $c_2$, and $c_3$ are represented by the $l_i$ is represented by the following equation $$\ell i = -\frac{C_0^T \tilde{B}_{i,0} C_i}{C_0^T \tilde{B}_{0,0} C_0}$$ [Formula 10]

$c_i \epsilon \mathbb{R}^3$: three-element vector obtained by removing (i+1) th component of $\{c_0, c_1, c_2, c_3\}^T$ $A \epsilon \mathbb{R}^{n \times 4}$: matrix that applies conversion from four pieces of polarization information to another n physical quantities $B_{i,j} \epsilon \mathbb{R}^{3 \times 3}$: matrix of 3 rows and 3 columns obtained by removing (i+1)th row and (j+1)th column of $A^T A$ ~: cofactor matrix where assuming that a matrix A is a matrix of m rows and 4 columns that gives conversion from four pieces of polarization information acquired from the imaging element to other m physical quantities, a matrix B in the equation [Formula 10] is a cofactor matrix of the matrix B of 3 rows and 3 columns obtained by removing (i+1)th row and (j+1)th column of $A^T A$.

In the image processing device according to a seventh aspect of the present invention, the matrix A is preferably a unit matrix of 4 rows and 4 columns.

In the image processing device according to an eighth aspect of the present invention, assuming that a parameter i is set to 1 to 3, the coefficients $l_1$, $l_2$, and $l_3$ in a matrix represented by the [Formula 2] are $l_i$, and the coefficients $c_1$, $c_2$, and $c_3$ are $c_i$, the $l_i$ is represented by the following equation $$\ell_i = -\frac{c_0 c_i}{c_1^2 + c_2^2 + c_3^2}$$ [Formula 18]

An imaging device according to a ninth aspect of the present invention comprises an imaging optical system, an imaging element in which n first-polarizers each having different polarization directions are regularly provided in a plurality of pixels consisting of photoelectric conversion elements arranged in a two-dimensional manner, assuming that n is an integer of 4 or more, and the image processing device according to any one of the first aspect to the eighth aspect. The processor acquires first image data from the imaging element.

An imaging device according to a tenth aspect of the present invention comprises an imaging optical system with a pupil region divided into a first pupil region, a second pupil region, and a third pupil region including three second-polarizers that polarize light passing through the first pupil region, the second pupil region, and the third pupil region in different directions and three wavelength selection elements that each pass the light in different wavelength bands from the first pupil region, the second pupil region, and the third pupil region, an imaging element in which four first-polarizers each having different polarization directions are regularly provided on a plurality of pixels consisting of photoelectric conversion elements arranged in a two-dimensional manner, and the image processing device according to the sixth aspect. The processor acquires the first image data from the imaging element, and the matrix A is an interference elimination matrix in a case where three pieces of image data, corresponding to light in each of three wavelength bands from which interference of light in each of three wavelength bands is eliminated from the first image data, are calculated.

An image processing method according to an eleventh aspect of the present invention, using a processor and a memory that stores a relationship between polarization directions, the method comprises: a step of acquiring, by the processor, first image data from an imaging element in which n first-polarizers having different polarization directions are regularly provided in a plurality of pixels consisting of photoelectric conversion elements arranged in a two-dimensional manner, assuming that n is an integer of 4 or more; a step of performing, by the processor, a demosaicing process on the first image data to generate n pieces of first polarized image data having different polarization directions; and a step of generating, by the processor, n or less pieces of second polarized image data by using the n pieces of first polarized image data and the relationship between the polarization directions stored in the memory.

An image processing program according to a twelfth aspect of the present invention causes a computer to realize a function of acquiring first image data from an imaging element in which n first-polarizers having different polarization directions are regularly provided in a plurality of pixels consisting of photoelectric conversion elements arranged in a two-dimensional manner, assuming that n is an integer of 4 or more, a function of performing a demosaicing process on the first image data to generate n pieces of first polarized image data having different polarization directions, and a function of generating n or less pieces of second polarized image data by using the n pieces of first polarized image data and the relationship between the polarization directions of the n first-polarizers.

DESCRIPTION OF THE PREFERRED EMBODIMENTS

Hereinafter, preferred embodiments of an image processing device, an imaging device, an image processing method, and an image processing program according to the present invention will be described with reference to accompanying drawings.

First Embodiment

[Configuration of Imaging Device]

Figure 1:
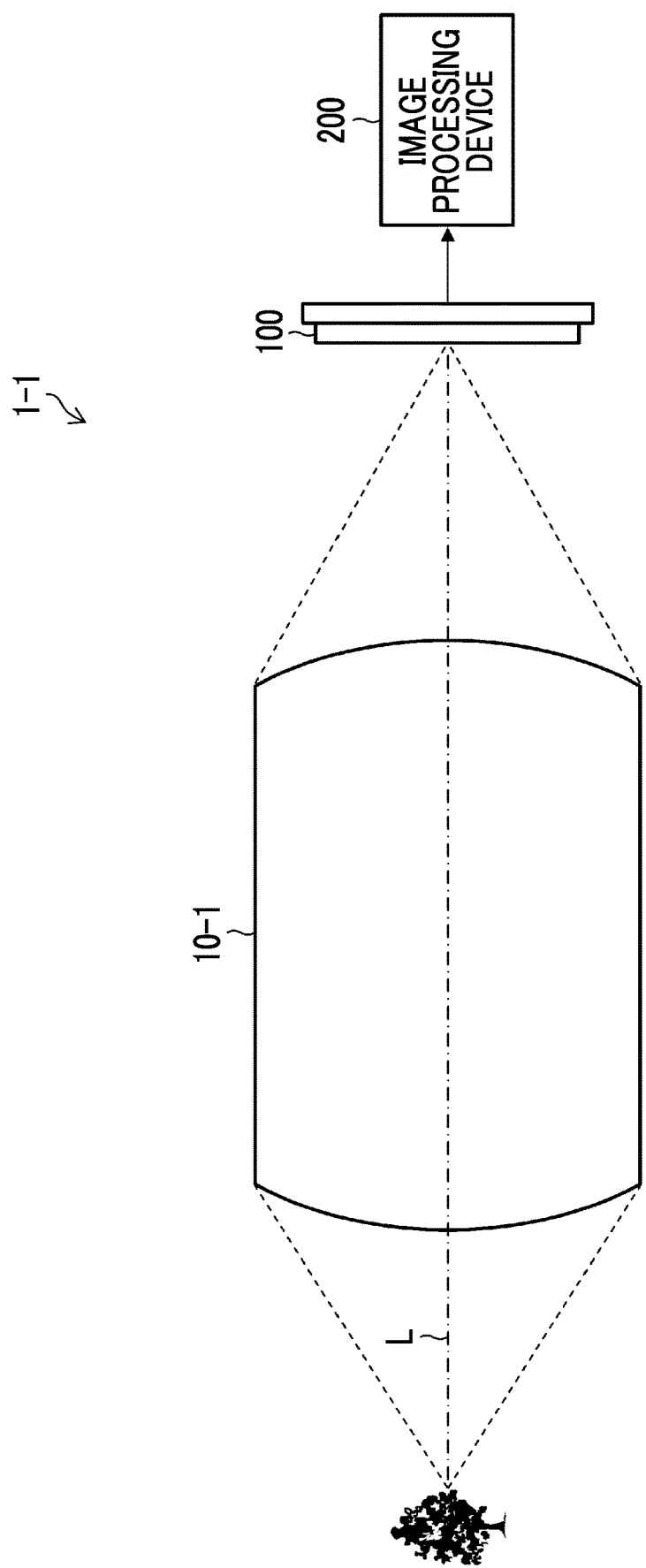
FIG. 1 is a diagram showing a schematic configuration of a first embodiment of an imaging device according to the present invention.

FIG. 1 is a diagram showing a schematic configuration of a first embodiment of the imaging device according to the present invention.

An imaging device 1-1 of the first embodiment is a polarization camera that captures four polarized images having different polarization directions and comprises an imaging optical system 10-1, an imaging element 100, and an image processing device 200.

The imaging optical system 10-1 is a general imaging lens that forms an optical image of a subject on a light receiving surface of the imaging element 100.

The imaging optical system 10-1 has a focus adjustment mechanism and a stop (not shown). The focus adjustment mechanism, for example, moves the entire imaging optical system 10-1 back and forth along an optical axis L to adjust focus.

<Imaging Element>

Figure 2:
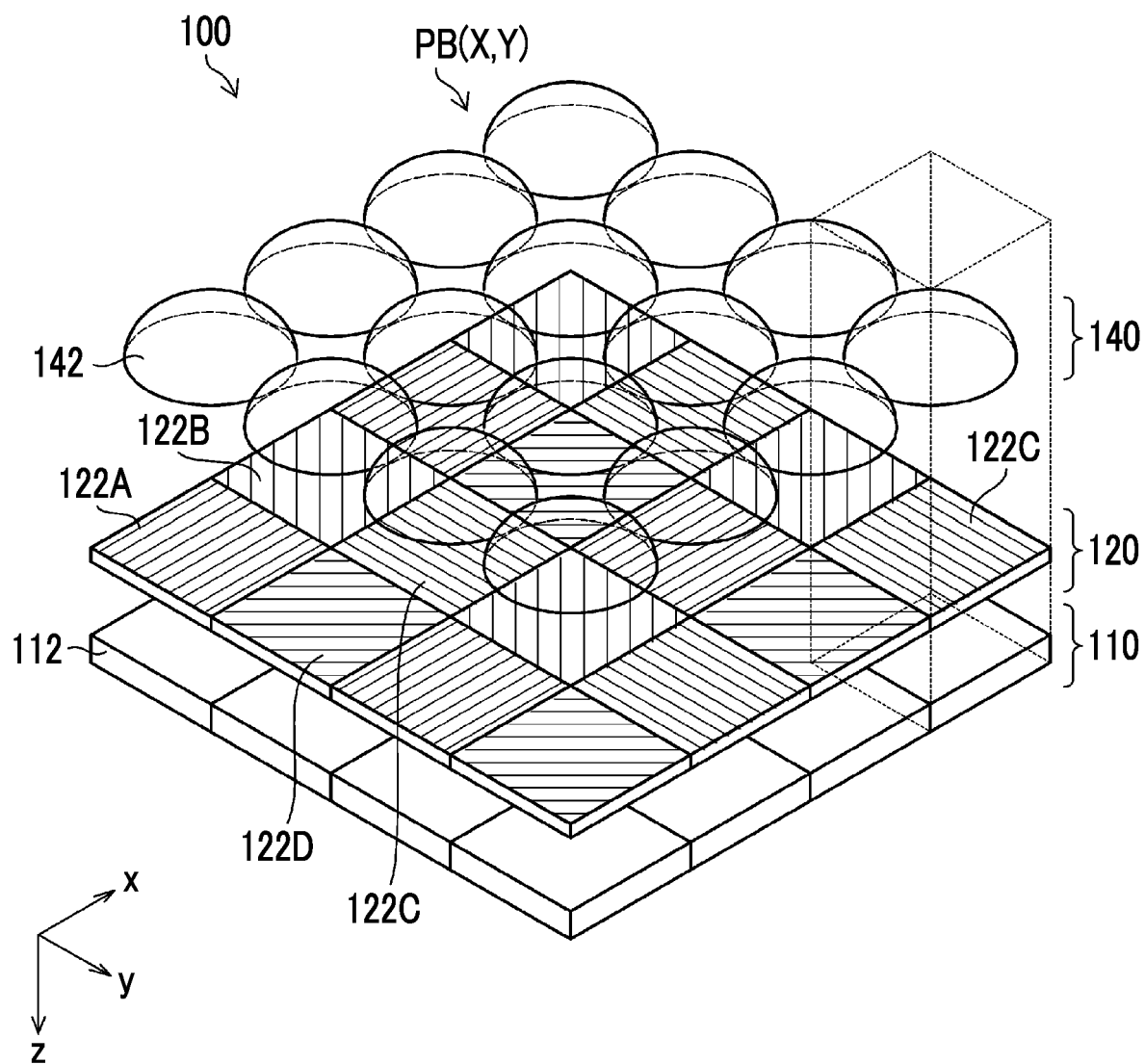
FIG. 2 is a diagram showing a schematic configuration of an imaging element shown in FIG. 1.
Figure 3:
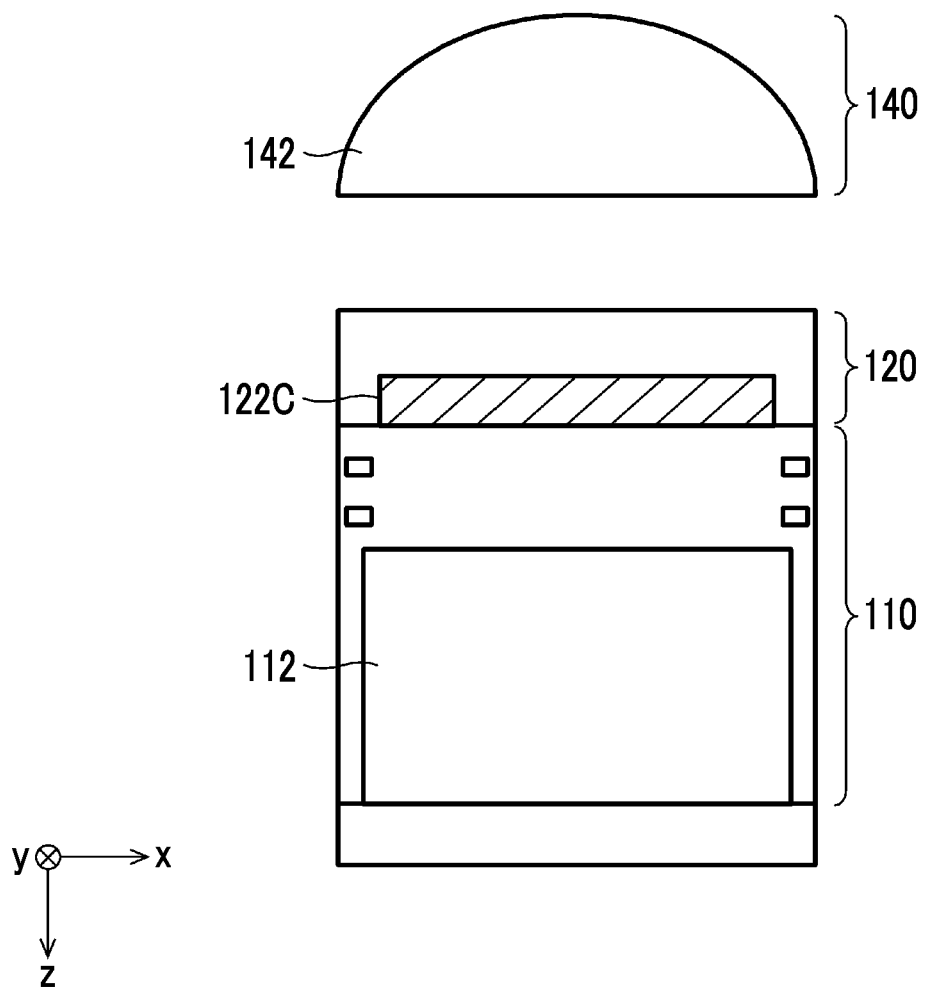
FIG. 3 is a cross-sectional view of a schematic configuration of one pixel (broken line portion in FIG. 2) shown in FIG. 2.

FIG. 2 is a diagram showing a schematic configuration of the imaging element shown in FIG. 1. FIG. 3 is a cross-sectional view of a schematic configuration of one pixel (broken line portion in FIG. 2) shown in FIG. 2.

The imaging element 100 is a complementary metal-oxide semiconductor (CMOS) type image sensor and has a pixel array layer 110, a polarization filter element array layer 120, and a microlens array layer 140. Each layer is disposed in the order of the pixel array layer 110, the polarization filter element array layer 120, and the microlens array layer 140 from an image plane side toward an object side. The imaging element 100 is not limited to the CMOS type, but may be an XY address type or a charge-coupled device (CCD) type image sensor.

The pixel array layer 110 is configured by arranging a large number of photodiodes 112, which are photoelectric conversion elements, in a two-dimensional manner. One photodiode 112 constitutes one pixel. Each photodiode 112 is regularly disposed along a horizontal direction (x-axis direction) and a vertical direction (y-axis direction).

In the polarization filter element array layer 120, n first-polarizers (polarization filter elements 122A, 122B, 122C, and 122D) having different polarization directions of light to be transmitted are regularly provided. Note that n is an integer of 4 or more and the present example shows a case of n=4.

Figure 4:
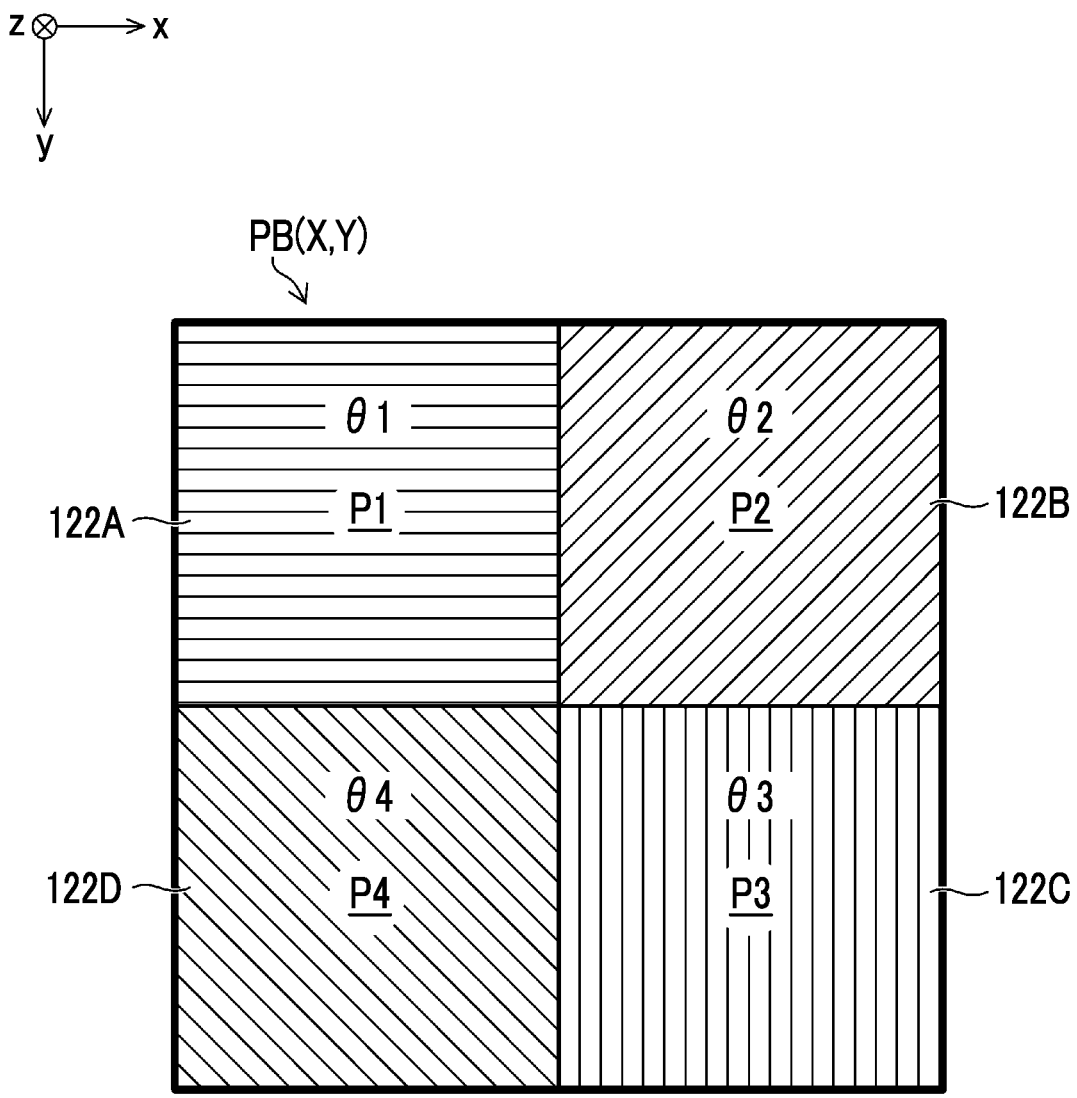
FIG. 4 is a diagram showing an example of a disposition pattern of polarization filter elements provided in each pixel block of the imaging element.

FIG. 4 is a diagram showing an example of a disposition pattern of polarization filter elements provided in each pixel block of the imaging element.

As shown in FIG. 4, one pixel block PB (X,Y) is composed of four adjacent (2×2) pixels P1, P2, P3, and P4, and the above-mentioned polarization filter elements 122A, 122B, 122C, and 122D are respectively provided in the pixels P1, P2, P3, and P4 in the pixel block PB.

The four polarization filter elements 122A, 122B, 122C, and 122D have different polarization directions by 45° from each other.

For example, in a case where the polarization filter element 122A transmits only a light component in a left-right direction (x-axis direction) on FIG. 4 of incident light, assuming that a polarization direction θ1 in this case is 0°, a polarization direction θ2 of the polarization filter element 122B is 45°, a polarization direction θ3 of the polarization filter element 122C is 90°, and a polarization direction θ4 of the polarization filter element 122D is 135°. The disposition pattern of the four types of polarization filter elements 122A, 122B, 122C, and 122D is not limited to the example shown in FIG. 4.

Figure 5:
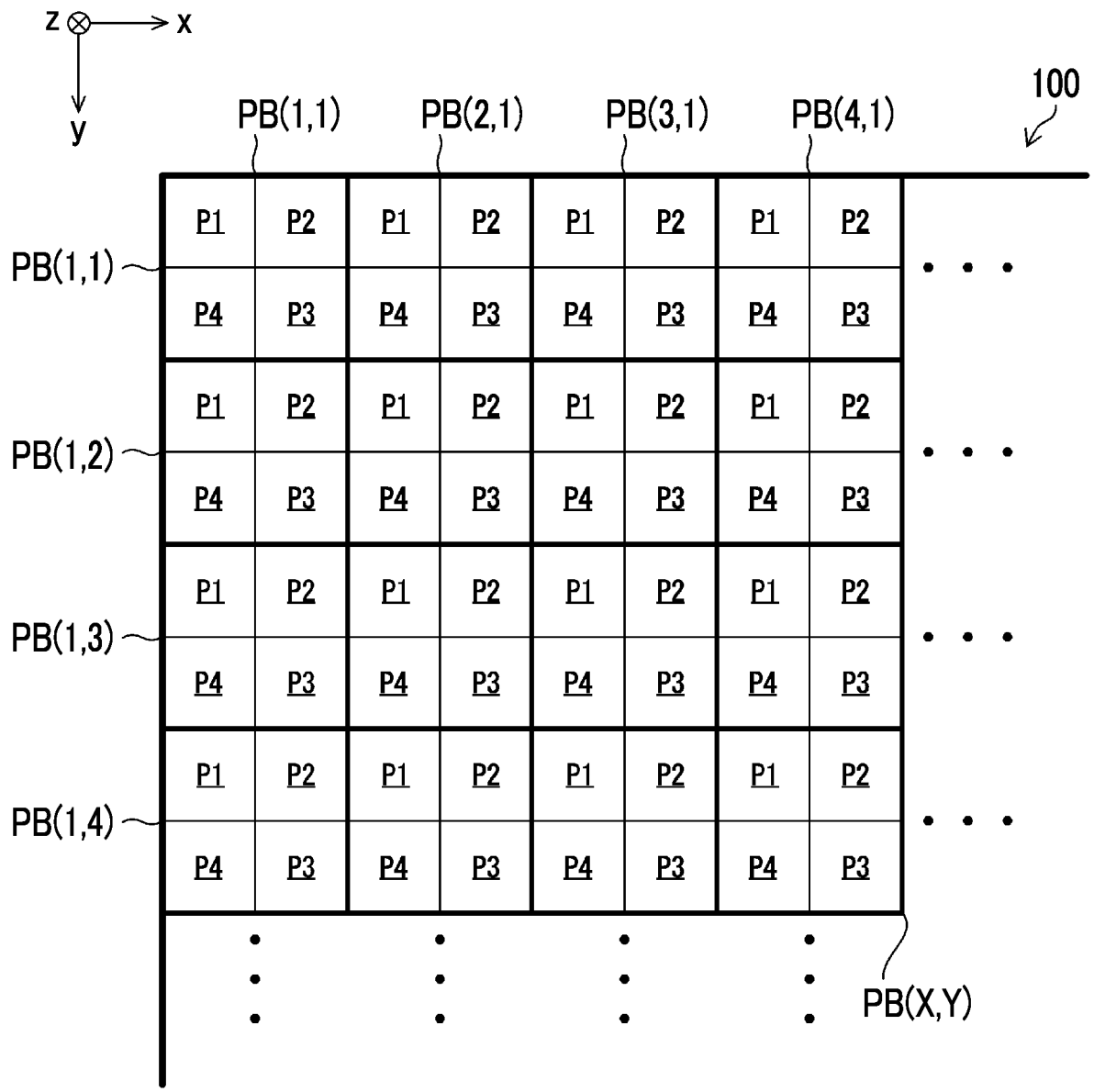
FIG. 5 is a diagram showing a schematic configuration of an array of pixels of the imaging element shown in FIG. 1.

FIG. 5 is a diagram showing a schematic configuration of an array of pixels of the imaging element shown in FIG. 1.

As shown in FIG. 5, the imaging element 100 has the four types of pixels P1 to P4 on the light receiving surface as described above. Four adjacent (2×2) pixel blocks PB (X,Y) are regularly arranged along the horizontal direction (x-axis direction) and the vertical direction (y-axis direction).

In a case where an imaging instruction input is received from a shutter release switch or the like, the imaging device 1-1 performs exposure control in the imaging element 100. The optical image of the subject formed on the light receiving surface of the imaging element 100 by this exposure control is converted into an electric signal by the imaging element 100. Charges corresponding to an amount of light incident on the photodiode 112 are accumulated in each pixel of the imaging element 100, and an electric signal corresponding to an amount of charge accumulated in each pixel is read out as an image signal (first image data) from the imaging element 100.

The first image data has four pieces of polarization information for each of the pixels P1 to P4 in the present example. Hereinafter, the first image data is referred to as "polarized RAW image data".

Returning to FIG. 1, the image processing device 200 acquires the polarized RAW image data from the imaging element 100 and performs image processing (RAW development processing) described below to generate four pieces of polarized image data (second polarized image data) for each polarization direction.

<Image Processing Device>

Figure 6:
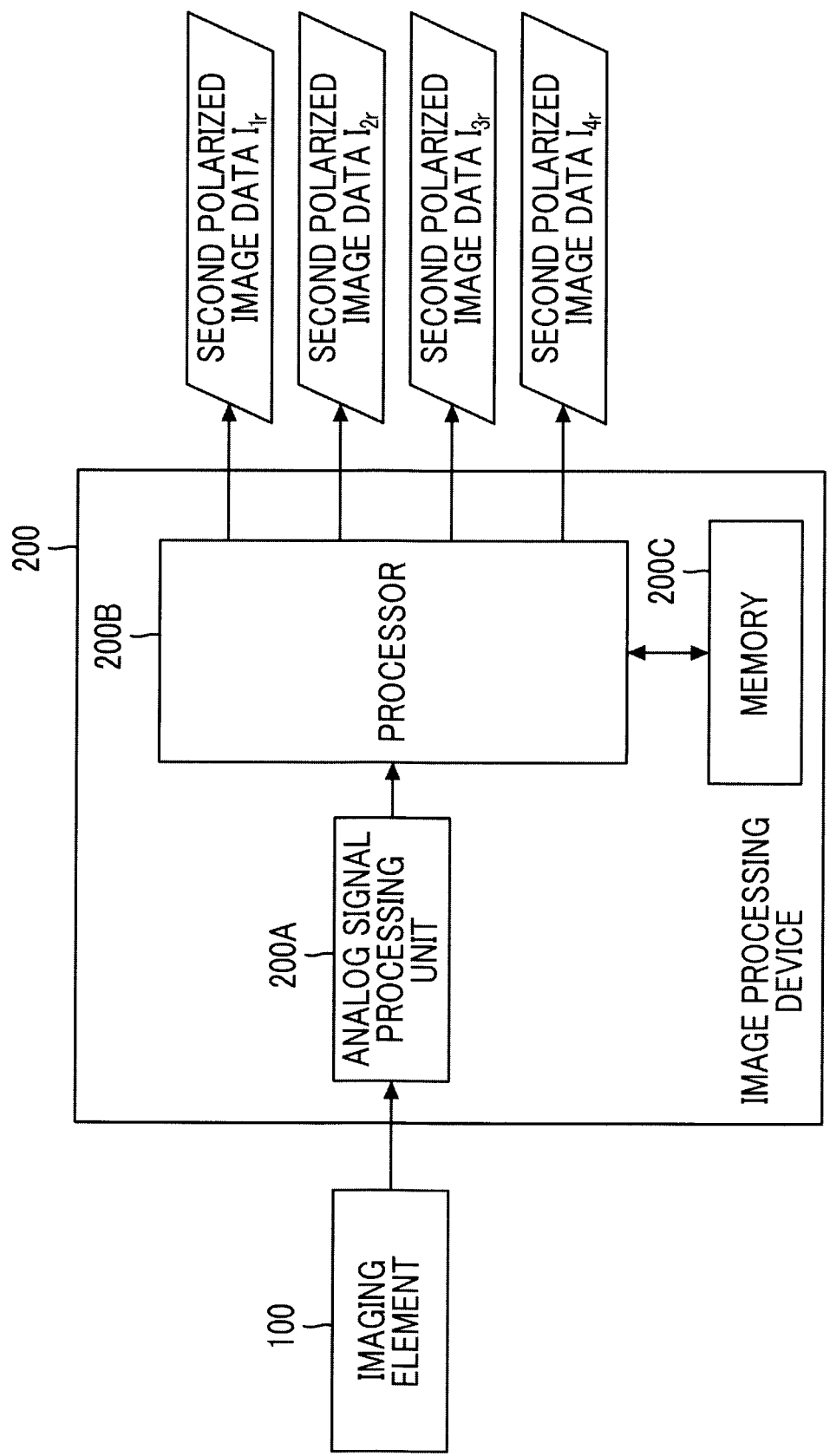
FIG. 6 is a block diagram showing a schematic configuration of an image processing device shown in FIG. 1.

FIG. 6 is a block diagram showing a schematic configuration of the image processing device shown in FIG. 1.

As shown in FIG. 6, the image processing device 200 includes an analog signal processing unit 200A, a processor 200B, and a memory 200C.

The analog signal processing unit 200A takes in an analog pixel signal output from the imaging element 100, performs predetermined signal processing (for example, sampling two correlation pile processing, amplification processing, and the like), then converts the pixel signal into a digital signal, and outputs the converted pixel signal.

The processor 200B performs acquisition process of acquiring the polarized RAW image data from the analog signal processing unit 200A. In a case where the imaging element 100 is a CMOS type imaging element, an analog signal processing unit and the like are often built in the CMOS type imaging element. In this case, the processor 200B can acquire the polarized RAW image data from the CMOS type imaging element.

The processor 200B performs a demosaicing process on the acquired polarized RAW image data to generate four pieces of polarized image data (first polarized image data) having different polarization directions.

<<Demosaicing Process>>

Next, the demosaicing process of the polarized RAW image data will be described.

In a case where the four pieces of polarized image data separated from the polarized RAW image data for each polarization direction are $I_1$, $I_2$, $I_3$, and $I_4$, respectively, the processor 200B performs calculation of the following equation $$\begin{Bmatrix} I_1 \\ I_2 \\ I_3 \\ I_4 \end{Bmatrix} * K \qquad \text{[Formula 1]}$$

however, $$K = k \otimes k$$

$$k = \begin{Bmatrix} 0.125a \\ 0 \\ 0.5 - 0.125a \\ 1 \\ 0.5 - 0.125a \\ 0 \\ 0.125a \end{Bmatrix}$$

where a is a parameter, to perform a first polarized image data generation process of generating the four pieces of first polarized image data subjected to the demosaicing process.

Among the four pieces of polarized image data ($I_1$, $I_2$, $I_3$, and $I_4$), the polarized image data $I_1$ is image data in which only a pixel value of the pixel P1 is included and pixel values of other pixel positions are zero. Similarly, the polarized image data $I_2$ is image data in which only the pixel value of the pixel P2 is included and the pixel values of other pixel positions are zero. The polarized image data $I_3$ is image data in which only the pixel value of the pixel P3 is included and the pixel values of other pixel positions are zero. The polarized image data $I_4$ is image data in which only the pixel value of the pixel P4 is included and the pixel values of other pixel positions are zero.

The equation [Formula 1] indicates the demosaicing process of estimating (interpolating) the pixel value at the pixel position where the pixel value is zero from the pixel values of the peripheral pixels by a convolution operation (convolution) between each piece of polarized image data $I_1$ to $I_4$ and a 7×7 kernel K having a weighting coefficient.

As for the coefficient of the kernel K, a larger weighting coefficient is assigned as a pixel position is closer to the pixel position from which the pixel value is estimated.

Further, a in the kernel K is a parameter, and sharpness can be controlled by adjusting the parameter a. For example, in a case where the parameter a approaches zero, the sharpness becomes low and noise becomes small. In a case where the parameter a becomes negatively large, the sharpness becomes high and the noise becomes large.

A size, weighting coefficient, and parameter a of the kernel K shown in the equation [Formula 1] are merely examples, and the present invention is not limited thereto.

Figure 7:
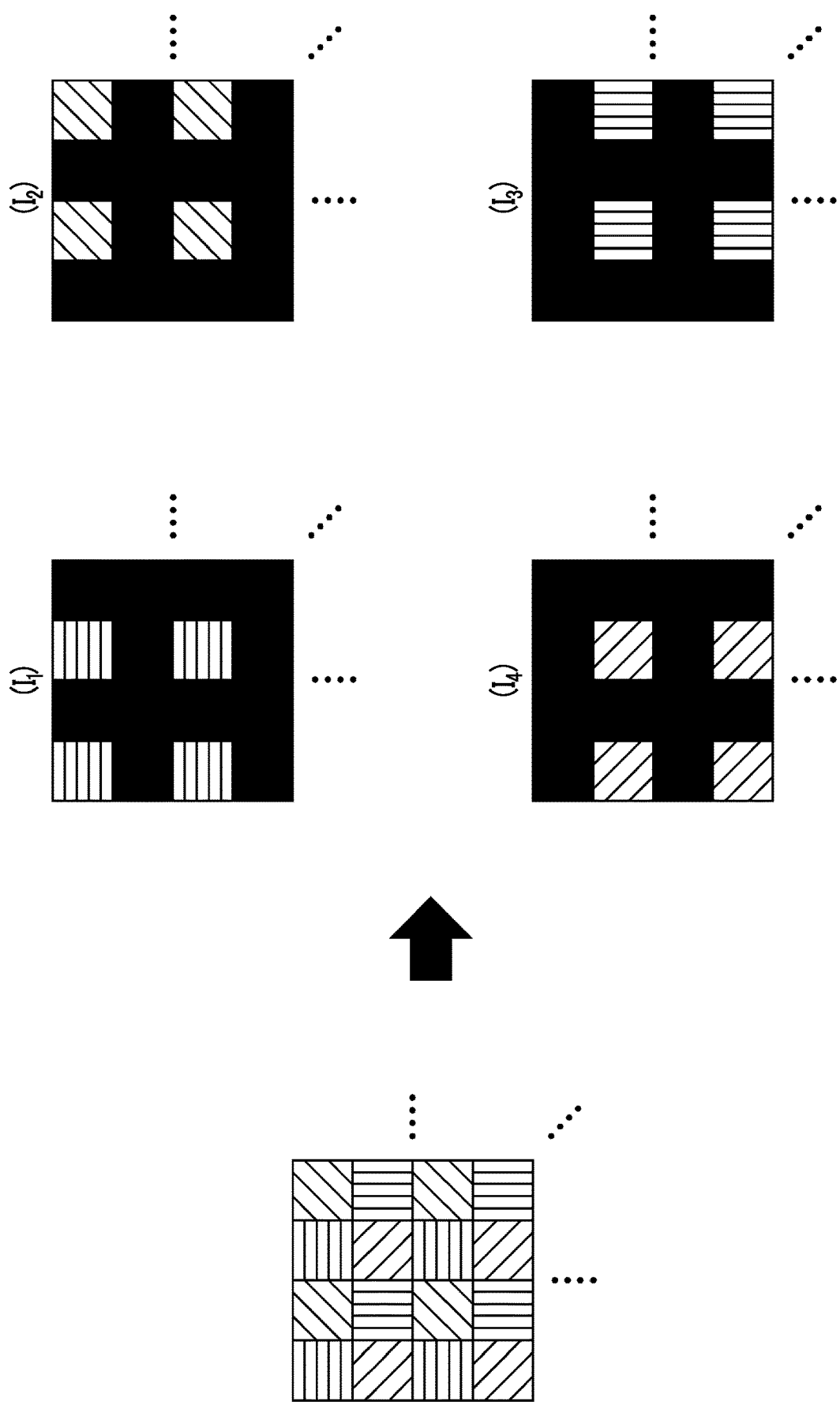
FIG. 7 is a schematic diagram showing an aspect in which pieces of polarized image data $I_1$ to $I_4$ for each polarization direction are separated from polarized RAW image data.

FIG. 7 is a schematic diagram showing an aspect in which the pieces of polarized image data $I_1$ to $I_4$ for each polarization direction are separated from the polarized RAW image data. With the separation of the pieces of polarized image data $I_1$ to $I_4$ for each polarization direction, it is easy to perform the subsequent processing.

In the polarized image data $I_1$ to $I_4$ shown in FIG. 7, pixel values of black-painted portions are zero. The demosaicing process estimates (interpolates) the pixel values of the black-painted portions based on the pixel values of the peripheral pixels and embeds the interpolated pixel values in the black-painted portions to generate the four pieces of first polarized image data.

Figure 8:
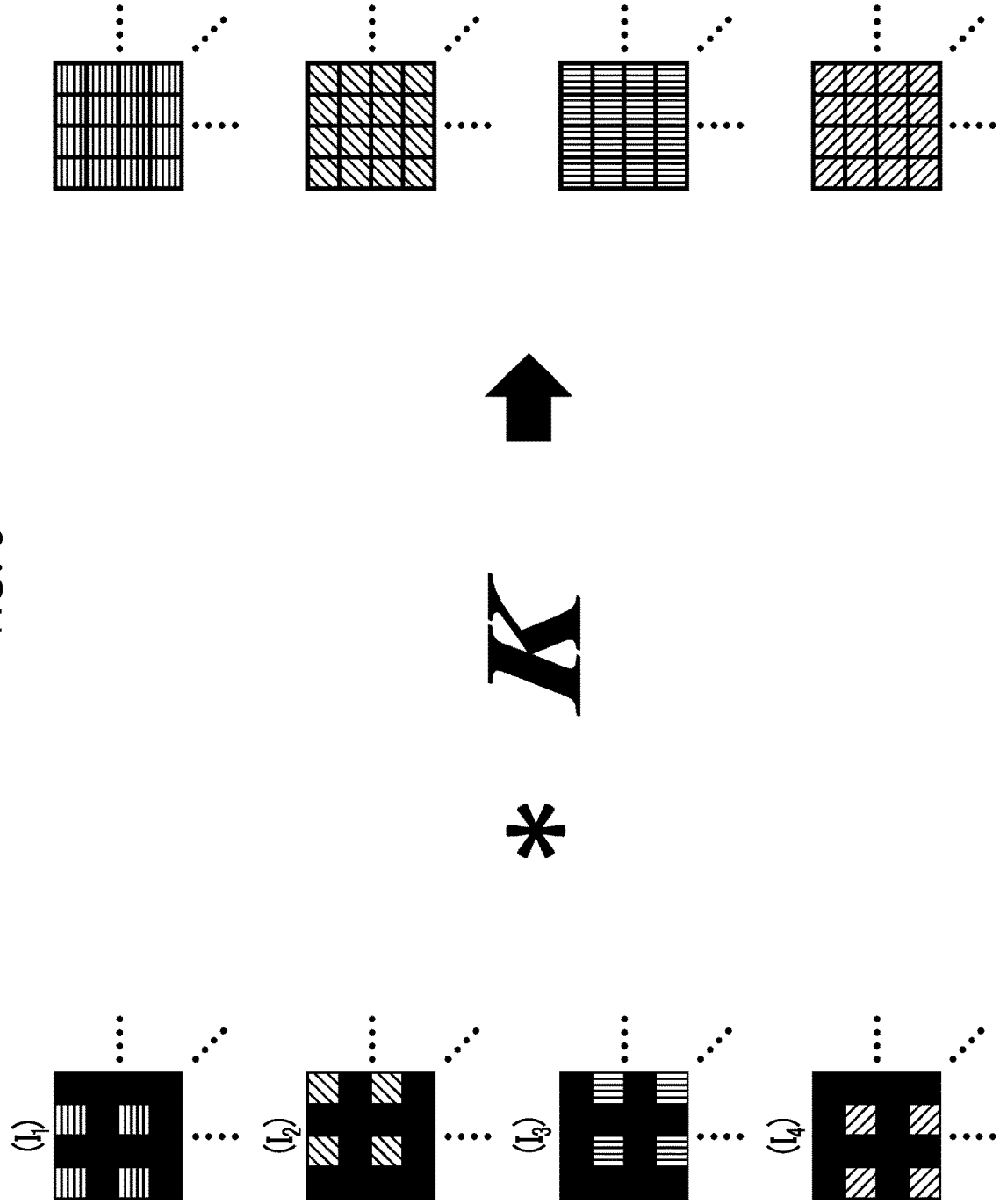
FIG. 8 is a schematic diagram showing an aspect in which each of the polarized image data $I_1$ to $I_4$ is subjected to convolution with a kernel K to generate four pieces of first polarized image data by interpolating pixel values of black-painted portions.

FIG. 8 is a schematic diagram showing an aspect in which each of the polarized image data $I_1$ to $I_4$ is subjected to convolution with the kernel K to generate the four pieces of first polarized image data by interpolating the pixel values of the black-painted portions.

The kernel K is stored, for example, in the memory 200C, and the processor 200B reads out the kernel K from the memory 200C and performs the demosaicing process of performing the convolution with the kernel K on each of the polarized image data $I_1$ to $I_4$ to generate the four pieces of first polarized image data.

In the above demosaicing process, the pixel value at a predetermined pixel position (pixel position of the black-painted portion shown in FIG. 8) is generated by the interpolation process for each of the polarized image data $I_1$ to $I_4$ from the spatial disposition relationship between the pixels P1 to P4 with four types of first-polarizers having different polarization directions, as shown in FIGS. 4 and 5.

<<Method of Generating Second Polarized Image Data>>

Next, a method will be described in which n or less pieces of second polarized image data having higher interpolation accuracy than the first polarized image data are generated by using n pieces of first polarized image data and a relationship between the polarization directions of n first-polarizers. The relationship between the polarization directions of the n first-polarizers will be described below.

Hereinafter, in order to simplify the description, a case where n is 4 will be described.

In a case where n is 4, the memory 200C shown in FIG. 6 stores, as the relationship between the polarization directions of the n (4) first-polarizers having different polarization directions, the following matrix $$\begin{bmatrix} l_1 & 1+l_1\frac{c_1}{c_0} & l_1\frac{c_2}{c_0} & l_1\frac{c_3}{c_0} \\ l_2 & l_2\frac{c_1}{c_0} & 1+l_2\frac{c_2}{c_0} & l_2\frac{c_3}{c_0} \\ l_3 & l_3\frac{c_1}{c_0} & l_3\frac{c_2}{c_0} & 1+l_3\frac{c_3}{c_0} \end{bmatrix} \quad \text{[Formula 2]}$$

where $l_1$ to $l_3$ and $c_0$ to $c_3$ are coefficients.

In a case where n is 4, the four pieces of first polarized image data are generated by the demosaicing process.

A pixel value that is originally present (hereinafter referred to as "first-pixel value $x_0$") and three pixel values generated by the demosaicing process (hereinafter referred to as "second-pixel value ($x_{1demo}$, $x_{2demo}$, and $x_{3demo}$)" are present at the same pixel position of the four pieces of first polarized image data.

Based on the relationship between the polarization directions of the four first-polarizers (matrix of [Formula 2]), which is stored in the memory 200C, and the four pixel values of each pixel position (first-pixel value ($x_0$) and three second-pixel values ($x_{1demo}$, $x_{2demo}$, and $x_{3demo}$), the processor 200B shown in FIG. 6 performs calculation of the following equation $$\begin{Bmatrix} x_{1r} \\ x_2 \\ x_{3r} \end{Bmatrix} = \begin{bmatrix} l_1 & 1+l_1\frac{c_1}{c_0} & l_1\frac{c_2}{c_0} & l_1\frac{c_3}{c_0} \\ l_2 & l_2\frac{c_1}{c_0} & 1+l_2\frac{c_2}{c_0} & l_2\frac{c_3}{c_0} \\ l_3 & l_3\frac{c_1}{c_0} & l_3\frac{c_2}{c_0} & 1+l_3\frac{c_3}{c_0} \end{bmatrix} \begin{Bmatrix} x_0 \\ x_{1demo} \\ x_{2demo} \\ x_{3demo} \end{Bmatrix} \quad \text{[Formula 3]}$$

to calculate three pixel values ($x_{1r}$, $x_{2r}$, and $x_{3r}$) obtained by correcting the three second-pixel values ($x_{1demo}$, $x_{2demo}$, and $x_{3demo}$), which are generated by the demosaicing process, at each pixel position.

Accordingly, the processor 200B performs a second polarized image data generation process of generating four or less (four in the present example) pieces of second polarized image data ($I_{1r}$, $I_{2r}$, $I_{3r}$, and $I_{4r}$) having higher interpolation accuracy than the four pieces of first polarized image data subjected to the demosaicing process.

The four pieces of second polarized image data ($I_{1r}$, $I_{2r}$, $I_{3r}$, and $I_{4r}$) generated in this manner can be output to a display device or recording device (not shown) in the subsequent stage for displaying or recording.

<<Relationship Between Polarization Directions>>

An example of the relationship between the polarization directions of the n first-polarizers includes a relationship between characteristics of the n first-polarizers and a physical quantity of a pixel corresponding to the first-polarizer. As an example, the relationship between the polarization directions of the first-polarizers in the case of n=4 shown in the matrix of [Formula 2] will be described.

In a case where non-polarized light (natural light as an example) having a uniform in-plane light amount distribution is incident on the imaging element 100, assuming that the four pieces of polarization information (pixel values) obtained from the four adjacent (2×2) pixels P1, P2, P3, and P4 shown in FIGS. 4 and 5 are $x_0$ to $x_3$, coefficients $c_0$ to $c_3$ in a matrix shown in [Formula 3] and the pixel values $x_0$ to $x_3$ satisfy the following equation $$\sum_{i=0}^{3} c_i x_i = 0 \quad \text{[Formula 4]}$$

In other words, there are coefficients $c_0$ to $c_3$ that satisfy the equation [Formula 4].

As a degree of uniformity, a distribution (brightness difference) is allowed within a range in which the pixel value can be corrected. As an example, confirmation is made at 20% or less. Further, non-polarization indicates that polarization in a plurality of directions is mixed, not polarization in a single direction.

Figure 9:
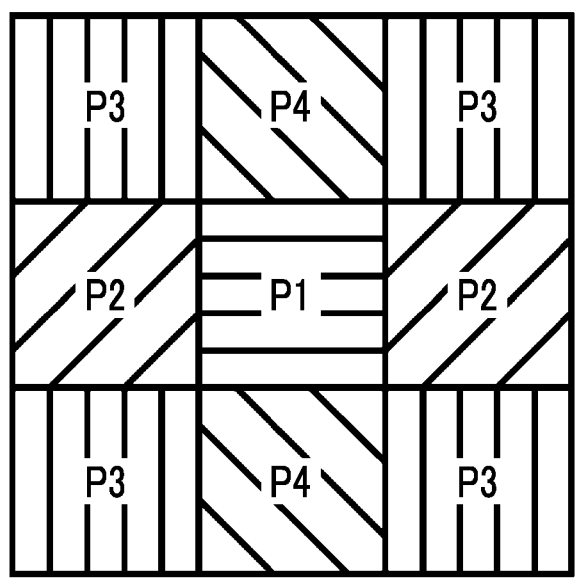
FIG. 9 is a diagram showing eight adjacent pixels centered on a pixel P1 (a total of nine pixels).
Figure 10:
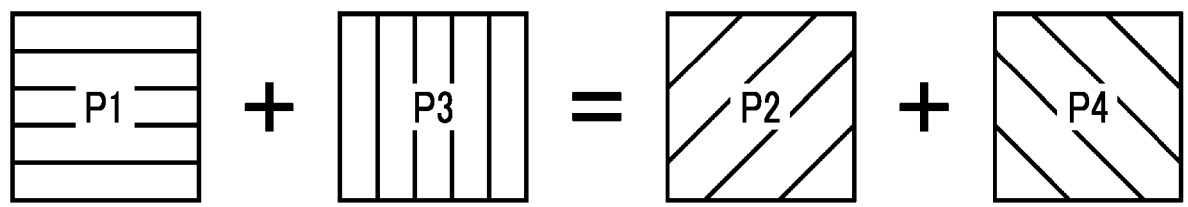
FIG. 10 is a schematic diagram showing a relationship between pixel values of four pixels P1, P2, P3, and P4 having different polarization directions.

FIG. 9 is a diagram showing eight adjacent pixels centered on the pixel P1 (a total of nine pixels). FIG. 10 is a schematic diagram showing a relationship between the pixel values of the four pixels P1, P2, P3, and P4 having different polarization directions.

As shown in FIG. 10, in a case where a spacing in the polarization direction is divided into four equal parts (45° spacing), $c_i$ in the equation [Formula 4] is $c_0=c_2=1$ and $c_1=c_3=-1$.

However, in reality, there is a slight deviation from the above relationship due to the influence of a manufacturing error of the imaging element 100 and the like.

For this reason, an entirely white input (uniformly non-polarized light) is incident on the imaging element 100, and an output result of the imaging element 100 is used for calibration.

Since there is no sharp change in an image that is completely white, the relationship between adjacent pixels may be investigated. Then, $c_i$ satisfying the equation [Formula 4] is determined. Since $c_i$ multiplied by a constant satisfies the same condition, $c_i$ is not uniquely determined. Therefore, a constraint such as a sum of $c_i$ being 1 is set to determine $c_i$.

The equation [Formula 4] is established also among four pixel values ($x_{0demo}$, $x_{1demo}$, $x_{2demo}$, and $x_{3demo}$), generated by the demosaicing process, having different polarization directions. A relationship between the pixel values ($x_{0demo}$, $x_{1demo}$, $x_{2demo}$, and $x_{3demo}$) and the coefficients $c_0$ to $c_3$ can be represented by the following equation $$c_0 x_{0demo} + c_1 x_{1demo} + c_2 x_{2demo} + c_3 x_{3demo} = 0. \quad \text{[Formula 5]}$$

The following equation [Formula 5'] is a modified equation of the above equation [Formula 5]

$$x_{0demo} = -(1/c_0)(c_1 x_{1demo} + c_2 x_{2demo} + c_3 x_{3demo}) \quad \text{[Formula 5']}$$

In a pixel having a certain polarization direction (for example, pixel P1 having polarization direction of 0°) among the four pixels P1, P2, P3, and P4 each having different polarization directions, an error between the first-pixel value, which is originally present, and the second-pixel values (pixel values in the same polarization direction) estimated by the demosaicing process is assumed to be δ.

Similarly, in three pixels each having different polarization directions by 45° from a pixel having a certain polarization direction (for example, pixels P2, P3, and P4 having polarization directions of 45°, 90°, and 135°) among the four pixels P1, P2, P3, and P4, errors between the first-pixel values, which are originally present, and the second-pixel values estimated by the demosaicing process are assumed to be $l_1\delta$, $l_2\delta$, and $l_3\delta$, respectively.

Coefficients $l_1$, $l_2$, and $l_3$ are the same as $l_1$, $l_2$, and $l_3$ in the matrix of [Formula 2]. A method of calculating the coefficients $l_1$, $l_2$, and $l_3$ will be described below.

Now, assuming that a true value (desired pixel value) of the pixel P2 whose polarization direction differs from that of the pixel P1 by 45° at the pixel position of the pixel P1 is $x_{1r}$, the pixel value $x_{1r}$ can be represented by the following equation $$x_{1r} = x_{1demo} + l_1 \delta. \quad \text{[Formula 6]}$$

The error $\delta$ in the above equation [Formula 6] is an error between the pixel value $x_0$, which is originally present, of the pixel P1 and the pixel value $x_{0demo}$ estimated by the demosaicing process. Therefore, the error can be represented by the following equation $$\delta = x_0 - x_{0demo} \quad \text{[Formula 7]}$$

In a case where the right side of the equation [Formula 7] is substituted into $\delta$ of the equation [Formula 6], [Formula 6] can be represented by the following equation $$x_{1r} = x_{1demo} + l_1(x_0 - x_{0demo}) \quad \text{[Formula 8]}$$

In a case where the right side of the equation [Formula 5'] is substituted into $x_{0demo}$ of the equation [Formula 8] and the equation is rearranged, the equation [Formula 8] can be represented by the following equation $$x_{1r} = l_1 x_0 + \{(1 + l_1 c_1/c_0) x_{1demo} + (l_1 c_2/c_0) x_{2demo} + (l_1 c_3/c_0) x_{3demo}\}. \quad \text{[Formula 9]}$$

The above equation [Formula 9] corresponds to a formula for calculating $x_{1r}$ in the equation [Formula 3].

Further, a formula for calculating the pixel value $x_{2r}$ (pixel value without error $l_2\delta$) of the pixel P3 whose polarization direction differs from that of the pixel P1 by 90° and a formula for calculating the pixel value $x_{3r}$ (pixel value without error $l_3\delta$) of the pixel P4 whose polarization direction differs from that of the pixel P1 by 135°, at the pixel position of the pixel P1, can be obtained in the same manner.

The equation [Formula 3] represents the formula for obtaining the pixel values ($x_{1r}$, $x_{2r}$, and $x_{3r}$) without these errors, and the matrix on the right side of the equation [Formula 3] is represented by [Formula 2].

The coefficients $l_1$ to $l_3$ shown in the equations [Formula 2] and [Formula 3] may be set to 1, respectively.

<<Method of Calculating Coefficients $l_1$, $l_2$, and $l_3$>>

In a case where the coefficients $l_1$, $l_2$, and $l_3$ in the matrix represented by [Formula 2] are represented by $l_i$ and the coefficients $c_1$, $c_2$, and $c_3$ are represented by $c_i$, $l_i$ can be represented by the following equation $$l_i = -\frac{C_0^T \tilde{B}_{i,0} C_i}{C_0^T \tilde{B}_{0,0} C_0} \quad \text{[Formula 10]}$$

$c_i \in \mathbb{R}^3$: three-element vector obtained by removing (i+1) th component of $\{c_0, c_1, c_2, c_3\}^T$ $A \in \mathbb{R}^{n \times 4}$: matrix that applies conversion from four pieces of polarization information to another n physical quantities $B_{i,j} \in \mathbb{R}^{3 \times 3}$: matrix of 3 rows and 3 columns obtained by removing (i+1)th row and (j+1)th column of $A^T A$ $\sim$: cofactor matrix where assuming that a matrix A is a matrix of m rows and 4 columns that applies conversion from the four pieces of polarization information acquired from the imaging element to other four physical quantities, a matrix B in the equation [Formula 10] is a cofactor matrix of the matrix B of 3 rows and 3 columns obtained by removing the (i+1)th row and the (j+1)th column of $A^T A$.

Now, the matrix A is assumed to be a unit matrix shown in [Formula 11]

$$A = \begin{bmatrix} 1 & 0 & 0 & 0 \\ 0 & 1 & 0 & 0 \\ 0 & 0 & 1 & 0 \\ 0 & 0 & 0 & 1 \end{bmatrix}. \quad \text{[Formula 11]}$$

$A^T A$ can be represented by a matrix shown in [Formula 12]

$$A^T A = \begin{bmatrix} 1 & 0 & 0 & 0 \\ 0 & 1 & 0 & 0 \\ 0 & 0 & 1 & 0 \\ 0 & 0 & 0 & 1 \end{bmatrix}. \quad \text{[Formula 12]}$$

The matrix $B_{i,j}$ obtained by removing the (i+1)th row and the (j+1)th column of $A^T A$ can be represented by [Formula 13]

$$B_{0,0} = \begin{bmatrix} 1 & 0 & 0 \\ 0 & 1 & 0 \\ 0 & 0 & 1 \end{bmatrix} \quad B_{2,0} = \begin{bmatrix} 0 & 0 & 0 \\ 1 & 0 & 0 \\ 0 & 0 & 1 \end{bmatrix} \quad \text{[Formula 13]}$$

$$B_{1,0} = \begin{bmatrix} 0 & 0 & 0 \\ 0 & 1 & 0 \\ 0 & 0 & 1 \end{bmatrix} \quad B_{3,0} = \begin{bmatrix} 0 & 0 & 0 \\ 1 & 0 & 0 \\ 0 & 1 & 0 \end{bmatrix}.$$

The cofactor matrix $\tilde{B}_{i,j}$ in the equation [Formula 10] can be represented by the following equation based on the matrix B in the equation [Formula 13]

$$\tilde{B}_{0,0} = \begin{bmatrix} 1 & 0 & 0 \\ 0 & 1 & 0 \\ 0 & 0 & 1 \end{bmatrix} \quad \tilde{B}_{2,0} = \begin{bmatrix} 0 & 0 & 0 \\ 1 & 0 & 0 \\ 0 & 0 & 0 \end{bmatrix} \quad \text{[Formula 14]}$$

$$\tilde{B}_{1,0} = \begin{bmatrix} 1 & 0 & 0 \\ 0 & 0 & 0 \\ 0 & 0 & 0 \end{bmatrix} \quad \tilde{B}_{3,0} = \begin{bmatrix} 0 & 0 & 0 \\ 0 & 0 & 0 \\ 1 & 0 & 0 \end{bmatrix}.$$

Further, since $c_i$ is a vector excluding the (i+1)th component, $c_i$ can be represented by the following equation $$c_0 = \begin{Bmatrix} c_1 \\ c_2 \\ c_3 \end{Bmatrix}, \, c_1 = \begin{Bmatrix} c_0 \\ c_2 \\ c_3 \end{Bmatrix}, \, c_2 = \begin{Bmatrix} c_0 \\ c_1 \\ c_3 \end{Bmatrix}, \, c_3 = \begin{Bmatrix} c_0 \\ c_1 \\ c_2 \end{Bmatrix}. \quad \text{[Formula 15]}$$

Accordingly, the coefficient $l_1$ in the equation [Formula 10] can be represented by the following equation $$l_1 = -\frac{c_0^T \tilde{B}_{1,0} c_1}{c_0^T \tilde{B}_{0,0} c_0} = -\frac{\{c_1 \; c_2 \; c_3\} \begin{bmatrix} 1 & 0 & 0 \\ 0 & 0 & 0 \\ 0 & 0 & 0 \end{bmatrix} \begin{Bmatrix} c_0 \\ c_2 \\ c_3 \end{Bmatrix}}{\{c_1 \; c_2 \; c_3\} \begin{bmatrix} 1 & 0 & 0 \\ 0 & 1 & 0 \\ 0 & 0 & 1 \end{bmatrix} \begin{Bmatrix} c_1 \\ c_2 \\ c_3 \end{Bmatrix}} = \quad \text{[Formula 16]}$$

$$-\frac{\{c_1 \ c_2 \ c_3\}\begin{Bmatrix} c_0 \\ 0 \\ 0 \end{Bmatrix}}{\{c_1 \ c_2 \ c_3\}\begin{Bmatrix} c_1 \\ c_2 \\ c_3 \end{Bmatrix}} = -\frac{c_0 c_1}{c_1^2 + c_2^2 + c_3^2}.$$

Similarly, the coefficients $l_2$ and $l_3$ in the equation [Formula 10] can also be represented by the following equations, respectively $$\ell_2 = -\frac{c_0 c_2}{c_1^2 + c_2^2 + c_3^2}, \ \ell_3 = -\frac{c_0 c_3}{c_1^2 + c_2^2 + c_3^2}. \quad \text{[Formula 17]}$$

Accordingly, the coefficients $l_1$ to $l_3$ in the equation [Formula 10] can be represented by the following equation $$\ell_i = -\frac{c_0 c_i}{c_1^2 + c_2^2 + c_3^2}. \quad \text{[Formula 18]}$$

The polarization directions (θ1 to θ4) of the four types of polarization filter elements 122A to 122D provided in the imaging element 100 of the present example are 0°, 45°, 90°, and 135°, which are different by 45°, obtained by dividing 180° into n (=4) equal parts. However, each of the polarization directions is not limited thereto.

Next, derivation of a coefficient $c_i$ in a cos-squared model will be described.

Assuming that n is an integer of 4 or more, the equation [Formula 4] can be represented by the following equation $$\sum_{i=0}^{n} Ci \cos^2(\theta - \phi i) = \sum_{i=0}^{n} Ci \cdot \frac{1}{2}\{1 + \cos 2(\theta - \phi i)\} = \quad \text{[Formula 19]}$$

$$\frac{1}{2}\sum_{i=0}^{n} Ci + \frac{1}{2}\cos 2\theta \sum_{i=0}^{n} Ci \cos 2\phi i + \frac{1}{2}\sin 2\theta \sum_{i=0}^{n} Ci \sin 2\phi i = 0.$$

In the equation [Formula 19], $\varphi_i$ is an angle indicating the polarization direction of a plurality of different pixels of the imaging element.

In order for the equation [Formula 19] to be established at any θ, it is necessary to satisfy the following equation $$\sum_{i=0}^{n} Ci = 0 \quad \text{[Formula 20]}$$

$$\sum_{i=0}^{n} Ci \cos 2\phi i = 0$$

$$\sum_{i=0}^{n} Ci \sin 2\phi i = 0.$$

Variables are redundant. Therefore, for example, in a case where $c_0=1$, the equation [Formula 20] can be rewritten as the following equation $$\sum_{i=1}^{n} Ci = -1 \quad \text{[Formula 21]}$$

$$\sum_{i=1}^{n} Ci \cos 2\phi i = -\cos 2\phi_0$$

$$\sum_{i=1}^{n} Ci \sin 2\phi i = -\sin 2\phi_0.$$

The equation [Formula 21] can be represented by the following equation $$\begin{bmatrix} 1 & 1 & \cdots & 1 \\ \cos 2\phi_1 & \cos 2\phi_2 & \cdots & \cos 2\phi_n \\ \sin 2\phi_1 & \sin 2\phi_2 & \cdots & \sin 2\phi_n \end{bmatrix} \begin{Bmatrix} c_1 \\ c_2 \\ \vdots \\ c_n \end{Bmatrix} = \begin{Bmatrix} -1 \\ -\cos 2\phi_0 \\ -\sin 2\phi_0 \end{Bmatrix}. \quad \text{[Formula 22]}$$

Here, in a case where $\Phi C = -\phi_0$ [Formula 23]

$$\phi i = \begin{Bmatrix} 1 \\ \cos 2\phi i \\ \sin 2\phi i \end{Bmatrix}, \Phi = \{\phi_1 \ \phi_2 \ \cdots \ \phi_n\}$$

$$C = \begin{Bmatrix} C_1 \\ C_2 \\ \vdots \\ C_n \end{Bmatrix}$$

, and $\|C\| \to \min$, it can be represented as $$C = -\Phi^T (\Phi \Phi^T)^{-1} \phi_0.$$

For example, assuming that $\varphi_0=0°$, $\varphi_1=45°$, $\varphi_2=90°$, and $\varphi_4=135°$, $c_0=1$, $c_1=-1$, $c_2=1$, and $c_3=-1$. Assuming that $\varphi_0=0°$, $\varphi_1=10°$, $\varphi_2=30°$, and $\varphi_4=60°$, $c_0=1$, $c_1=-1.6527$, $c_2=0.8794$, and $c_3=-0.2267$.

Second Embodiment

Figure 11:
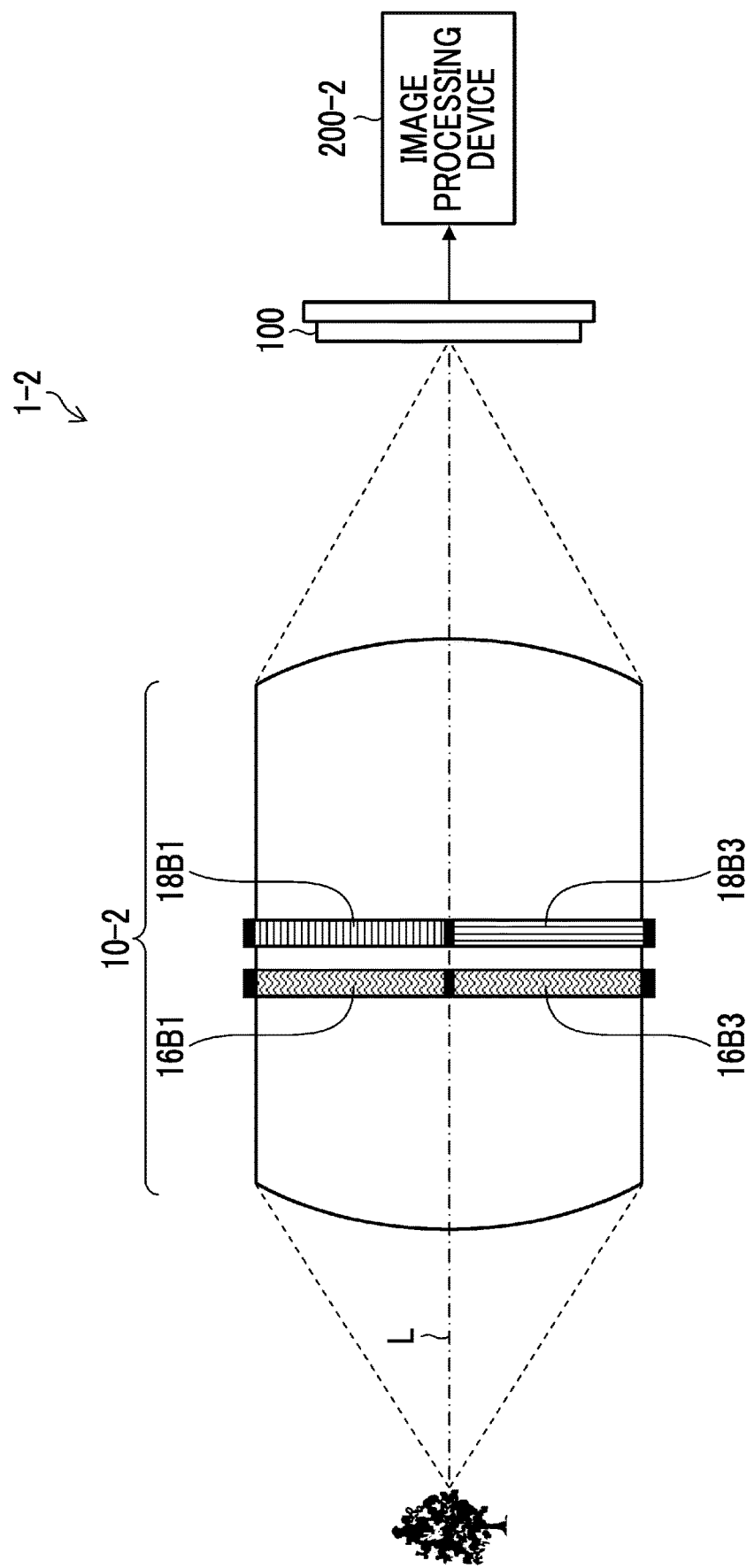
FIG. 11 is a diagram showing a schematic configuration of a second embodiment of the imaging device according to the present invention.

FIG. 11 is a diagram showing a schematic configuration of a second embodiment of the imaging device according to the present invention.

An imaging device 1-2 of the second embodiment is a multispectral camera that captures three or more images (multispectral images) each having different wavelength bands and comprises an imaging optical system 10-2, the imaging element 100, and an image processing device 200-2.

In FIG. 11, the same reference numeral is assigned to a part common to the imaging device 1-1 of the first embodiment shown in FIG. 1 and detailed description thereof will be omitted. The image processing device 200-2 is common to the image processing device 200 shown in FIG. 6, but the coefficients used for the calculation are different.

In the imaging device 1-2 of the second embodiment, as compared with the imaging device 1-1 of the first embodiment, the imaging optical system 10-2 is mainly different from the imaging optical system 10-1 of the imaging device 1-1 of the first embodiment.

<<Imaging Optical System>>

The imaging optical system 10-2 is configured by combining a plurality of lenses 12. The imaging optical system 10-2 has a bandpass filter unit 16 and a polarization filter unit 18 near a pupil thereof. Further, the imaging optical system 10-2 has a focus adjustment mechanism (not shown).

The focus adjustment mechanism, for example, moves the entire imaging optical system 10-2 back and forth along an optical axis L to adjust focus.

A pupil region of the imaging optical system 10-2 is divided into a first pupil region, a second pupil region, and a third pupil region. The bandpass filter unit 16 has three wavelength selection elements that respectively allow light in different wavelength bands to pass from the first pupil region, the second pupil region, and the third pupil region.

Figure 12:
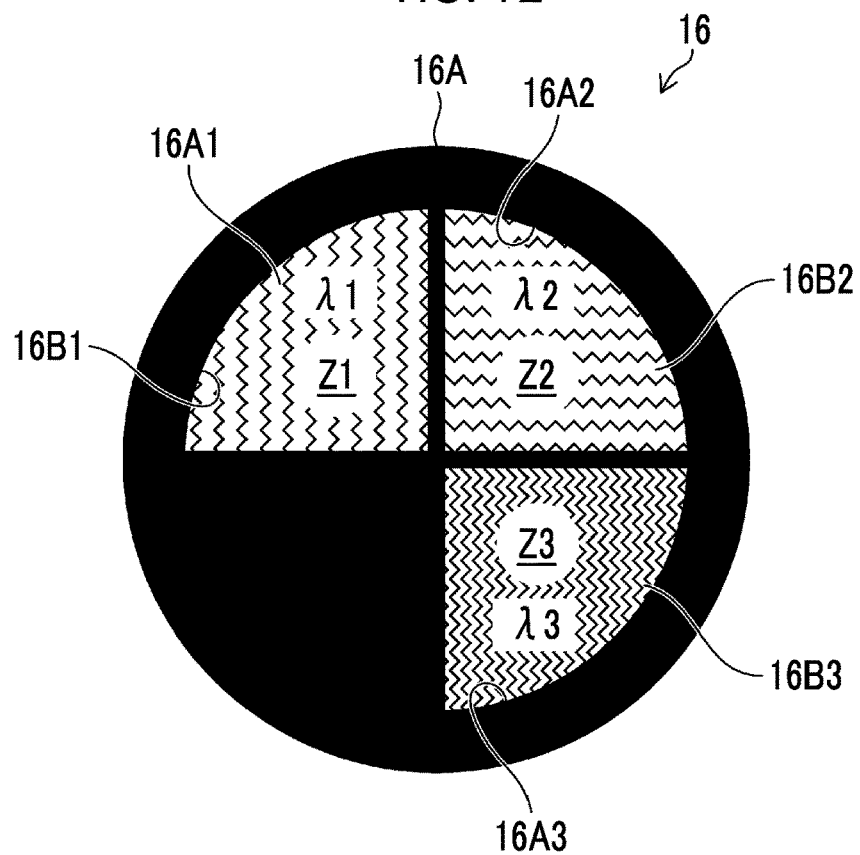
FIG. 12 is a front view of an embodiment of a bandpass filter unit shown in FIG. 11.

FIG. 12 is a front view of an embodiment of the bandpass filter unit shown in FIG. 11.

The bandpass filter unit 16 shown in FIG. 12 has a first pupil region Z1 through which light of a first wavelength band λ1 passes, a second pupil region Z2 through which light of a second wavelength band λ2 passes, and a third pupil region Z3 through which light of a third wavelength band λ3 passes to function as a wavelength selection unit that transmits the light in different wavelength bands for each of the first pupil region Z1, the second pupil region Z2, and the third pupil region Z3.

That is, the bandpass filter unit 16 is disposed such that a center thereof matches the optical axis L of the imaging optical system 10-2 and is composed of a light-shielding frame 16A provided with three fan-shaped opening areas 16A1, 16A2, and 16A3 having a central angle of 90° and bandpass filters 16B1, 16B2, and 16B3 which are three wavelength selection elements provided in the opening areas 16A1, 16A2, and 16A3 of the frame 16A.

Figure 13:
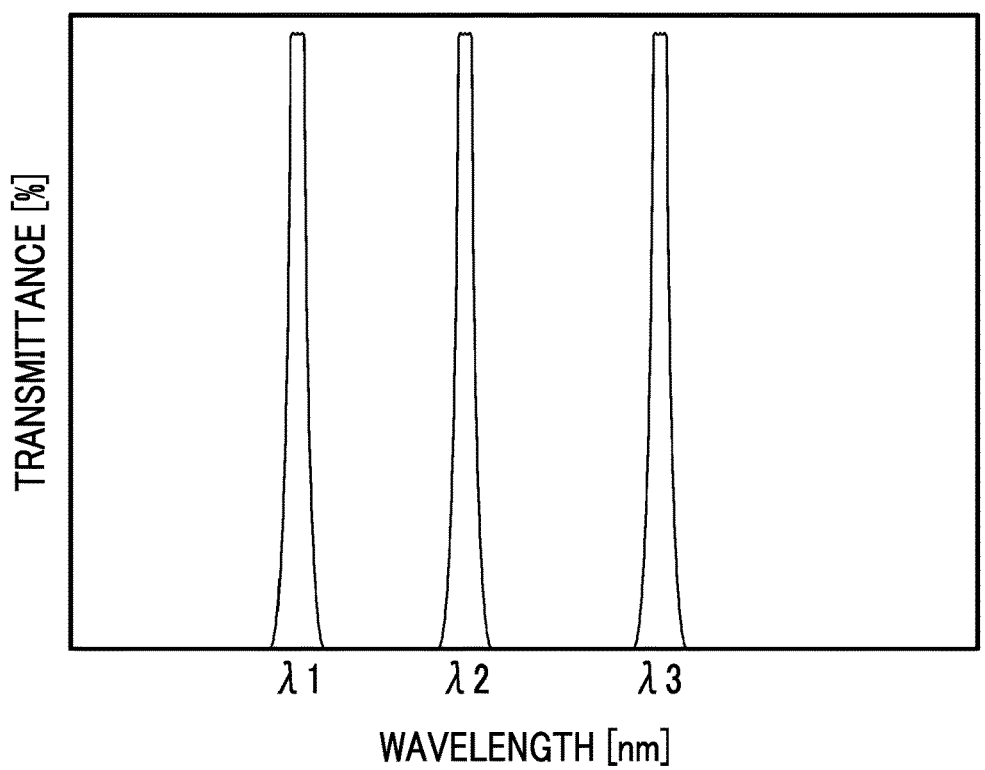
FIG. 13 is a graph showing an example of transmission wavelength characteristics of each bandpass filter.

FIG. 13 is a graph showing an example of transmission wavelength characteristics of each bandpass filter.

The bandpass filters 16B1 to 16B3 transmit the light in different wavelength bands, respectively. Specifically, the bandpass filter 16B1 transmits the light of the wavelength band λ1. The bandpass filter 16B2 transmits the light of the wavelength band λ2. The bandpass filter 16B3 transmits the light of the wavelength band λ3.

The polarization filter unit 18 has three second-polarizers that polarize the light passing through the pupil-divided first pupil region Z1, second pupil region Z2, and third pupil region Z3 in different directions, respectively.

Figure 14:
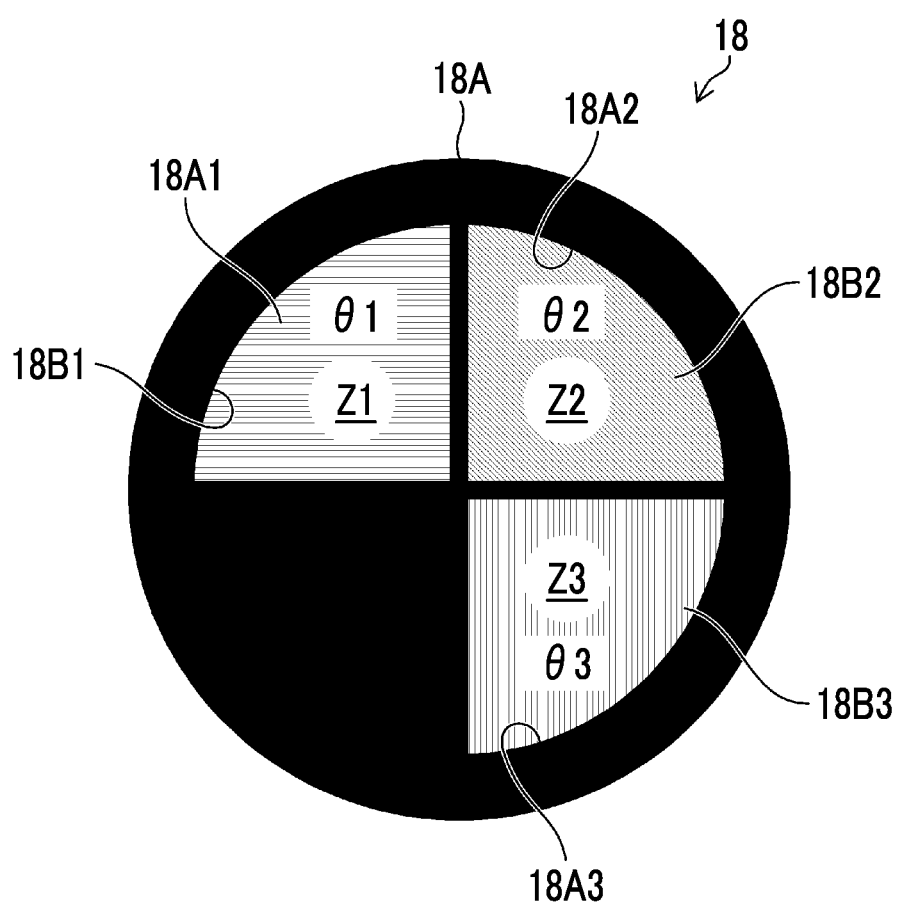
FIG. 14 is a front view of an embodiment of a polarization filter unit shown in FIG. 11.

FIG. 14 is a front view of an embodiment of the polarization filter unit shown in FIG. 11.

Similarly to the bandpass filter unit 16 shown in FIG. 11, the polarization filter unit 18 shown in FIG. 14 is disposed such that a center thereof matches the optical axis L of the imaging optical system 10-2 and is composed of a light-shielding frame 18A provided with three fan-shaped opening areas 18A1, 18A2, and 18A3 having a central angle of 90° and the three second-polarizers (polarization filters 18B1, 18B2, and 18B3) that polarize the light passing through the first pupil region Z1, the second pupil region Z2, and the third pupil region Z3 in different directions, respectively.

The bandpass filter unit 16 and the polarization filter unit 18 are disposed close to each other, and projection shapes of the first pupil regions Z1, the second pupil regions Z2, and the third pupil regions Z3 of the filter units are identical. Therefore, the light transmitted through the bandpass filter 16B1 of the bandpass filter unit 16 passes only through the polarization filter 18B1 of the polarization filter unit 18. Similarly, the light transmitted through the bandpass filter 16B2 passes only through the polarization filter 18B2, and the light transmitted through the bandpass filter 16B3 passes only through the polarization filter 18B3.

Polarization directions (θ1, θ2, and θ3) of the polarization filters 18B1, 18B2, and 18B3 of the polarization filter unit 18 of the present example are identical to the polarization directions (θ1, θ2, and θ3) of the polarization filter elements 122A, 122B, and 122C, which are provided in the pixels P1, P2, P3 of the imaging element 100.

Therefore, the light in the wavelength band λ1 in the polarization direction θ1 passing through the first pupil region Z1 is incident on each of the photodiodes 112 of the pixels P1 having the same polarization direction θ1 of the imaging element 100 and the pixels P2 and P4 whose polarization directions differ from the polarization direction θ1 by ±45°. Similarly, the light in the wavelength band λ2 in the polarization direction θ2 passing through the second pupil region Z2 is incident on each of the photodiodes 112 of the pixels P2 having the same polarization direction θ2 of the imaging element 100 and the pixels P3 and P1 whose polarization directions differ from the polarization direction θ2 by ±45°, and the light in the wavelength band λ3 in the polarization direction θ3 passing through the third pupil region Z3 is incident on each of the photodiodes 112 of the pixels P3 having the same polarization direction θ3 of the imaging element 100 and the pixels P2 and P4 whose polarization directions differ from the polarization direction θ3 by ±45°.

The light in the wavelength band λ1 in the polarization direction θ1, the light in the wavelength band λ2 in the polarization direction θ2, and the light in the wavelength band λ3 in the polarization direction θ3, which respectively pass through the first pupil region Z1, second pupil region Z2, and third pupil region Z3 of the imaging optical system 10-2, are incident on the photodiode of the pixel P1 of the imaging element 100.

That is, the light of the respective wavelength bands λ1 to λ3 is incident (interfered) on the photodiode of the pixel P1 of the imaging element 100. Similarly, the light of the respective wavelength bands λ1 to λ3 is incident also on the photodiodes of the pixels P2 to P4 of the imaging element 100.

Therefore, the image processing device 200-2 (FIG. 11) performs an interference elimination process to generate image signals having the respective wavelength bands λ1 to λ3.

In a case where the interference elimination is performed, the calculation shown in the equation [Formula 3] is also performed to calculate the three pixel values ($x_{1r}$, $x_{2r}$, and $x_{3r}$) obtained by correcting the three second-pixel values ($x_{1demo}$, $x_{2demo}$, and $x_{3demo}$), which are generated by the demosaicing process, at each pixel position. In this case, the three pixel values ($x_{1r}$, $x_{2r}$, and $x_{3r}$) are pixel values of the respective wavelength bands λ1 to λ3.

Further, in a case where the interference elimination is performed, an entirely white input is incident on the imaging element 100, to acquire an output result of the imaging element 100, by opening only any one of the three pupil regions of the first pupil regions Z1, the second pupil regions Z2, and the third pupil regions Z3 of the bandpass filter unit 16 and the polarization filter unit 18 and shielding other pupil regions. This is performed for each of the three pupil regions of the first pupil region Z1, the second pupil region Z2, and the third pupil region Z3. An interference relationship between adjacent pixels is investigated by using the output result of the imaging element 100 obtained in this manner to determine $c_i$ satisfying the equation [Formula 4].

The matrix A (matrix that is the basis for obtaining the cofactor matrix B), shown in the equation [Formula 10], in the case of obtaining the coefficient $l_i$ is used as an interference elimination matrix.

The memory 200C of the image processing device 200 shown in FIG. 6 stores the matrix shown in [Formula 2] in a case where the interference elimination is performed. In the case of performing the interference elimination, the processor 200B can acquire three spectral images (multispectral images) corresponding to the respective wavelength bands λ1 to λ3 by performing the calculation shown in the equation [Formula 3] based on the relationship between the polarization directions of the four first-polarizers for the interference elimination (matrix of [Formula 2]) and the four pixel values at each pixel position (first-pixel value ($x_0$), three second-pixel values ($x_{1demo}$, $x_{2demo}$, and $x_{3demo}$)), which are stored in the memory 200C.

Each of the three pupil regions of the first pupil regions Z1, the second pupil regions Z2, and the third pupil regions Z3 of the bandpass filter unit 16 and the polarization filter unit 18 of the imaging optical system 10-2 is fan-shaped with the central angle of 90°, but may be a fan shape with a central angle of 120°. Further, the three pupil regions are not limited to the fan shape and may be composed of one circle centered on the optical axis L and two annular bands.

[Other]

Although the imaging element 100 of the present embodiment does not comprise a color filter, a red filter, a green filter, or a blue filter may be repeatedly disposed in each pixel of the imaging element 100 in a Bayer array for each of 2×2 pixel blocks PB, for example. With the above disposition, it is possible to acquire a plurality of polarized images having different polarization directions for each color of red, green, and blue and to capture 9 (=3×3) multispectral images at maximum by providing a bandpath filter for selecting the wavelength band of 3 or less within each wavelength band of the red filter, the green filter, or the blue filter.

Further, the present invention is not limited to the imaging device and includes, for example, the image processing device 200 shown in FIG. 6 and the image processing method and the image processing program in the image processing device 200 shown in FIG. 6.

In this case, the image processing method comprises the processor 200B and the memory 200C, and the processor 200B executes each step shown below. That is, the processor 200B executes a step of acquiring the polarized RAW image data (first image data) from the imaging element 100, a step of performing the demosaicing process on the first image data to generate the four pieces of first polarized image data having different polarization directions, and a step of generating the four or less pieces of second polarized image data by using the four pieces of first polarized image data and the relationship between the polarization directions of the four first-polarizers stored in the memory 200C.

The image processing program causes a computer to realize the above image processing method.

In the present embodiment, for example, a hardware structure of a processing unit that executes various types of processing of the processor 200B is the following various processors. The various processors include, for example, a central processing unit (CPU) which is a general-purpose processor that executes software (program) to function as various processing units, a programmable logic device (PLD) which is a processor whose circuit configuration can be changed after manufacturing such as a field programmable gate array (FPGA), and a dedicated circuitry which is a processor having a circuit configuration specifically designed to execute specific processing such as an application specific integrated circuit (ASIC), and the like.

One processing unit may be composed of one of these various processors or may be composed of two or more processors of the same type or different types (for example, a plurality of FPGAs or a combination of CPU and FPGA).

The plurality of processing units may be composed of one processor. As an example of constituting the plurality of processing units by one processor, first, there is a form in which one processor is composed of a combination of one or more CPUs and software, as represented by a computer such as a client or a server, and the one processor functions as the plurality of processing units. Second, there is a form in which a processor that realizes the functions of the entire system including the plurality of processing units by one integrated circuit (IC) chip is used, as represented by a system on chip (SoC) or the like. As described above, the various processing units are configured by using one or more various processors as the hardware structure.

Further, the hardware structure of the various processors is, more specifically, circuitry in which circuit elements such as semiconductor elements are combined.

It is needless to say that the present invention is not limited to the embodiments described above and various modifications can be made within a range not departing from the spirit of the present invention.

EXPLANATION OF REFERENCES

1-1, 1-2: imaging device
10-1, 10-2: imaging optical system
12: lens
16: bandpass filter unit
16A: frame
16A1, 16A2, 16A3: opening area
16B1, 16B2, 16B3: bandpass filter
18: polarization filter unit
18A: frame
18A1, 18A2, 18A3: opening area
18B1, 18B2, 18B3: polarization filter
100: imaging element
110: pixel array layer
112: photodiode
120: polarization filter element array layer
122A, 122B, 122C, 122D: polarization filter element
140: microlens array layer
200: image processing device
200A: analog signal processing unit
200B: processor
200C: memory
L: optical axis

What is claimed is:

1. An image processing device comprising:

a processor; and a memory that stores a relationship between polarization directions, wherein the processor performs image processing, and performs an acquisition process of acquiring first image data from an imaging element in which n first-polarizers having different polarization directions are regularly provided in a plurality of pixels consisting of photoelectric conversion elements arranged in a two-dimensional manner, assuming that n is an integer of 4 or more, a first polarized image data generation process of performing a demosaicing process on the first image data to generate n pieces of first polarized image data according to the different polarization directions, and a second polarized image data generation process of generating n or less pieces of second polarized image data by using the n pieces of first polarized image data and the relationship between the polarization directions stored in the memory, wherein in a case where the n is 4,
assuming that four pieces of polarized image data separated from the first image data for each polarization direction are I1, I2, I3, and I4, respectively, the processor performs calculation of the following equation $$\begin{Bmatrix} I_1 \\ I_2 \\ I_3 \\ I_4 \end{Bmatrix} * K \qquad \text{[Formula 1]}$$

however, $$K = k \otimes k$$

$$k = \begin{Bmatrix} 0.125a \\ 0 \\ 0.5 - 0.125a \\ 1 \\ 0.5 - 0.125a \\ 0 \\ 0.125a \end{Bmatrix}$$

where a is a parameter,
to generate four pieces of first polarized image data subjected to the demosaicing process.

2. The image processing device according to claim 1, wherein the relationship between the polarization directions is a relationship between characteristics of the n first-polarizers and a physical quantity of a pixel corresponding to the first-polarizer.

3. The image processing device according to claim 1, wherein in a case where the n is 4,
the memory stores,
as the relationship between the polarization directions of the n first-polarizers, the following matrix $$\begin{bmatrix} l_1 & 1+l_1\frac{c_1}{c_0} & l_1\frac{c_2}{c_0} & l_1\frac{c_3}{c_0} \\ l_2 & l_2\frac{c_1}{c_0} & 1+l_2\frac{c_2}{c_0} & l_2\frac{c_3}{c_0} \\ l_3 & l_3\frac{c_1}{c_0} & l_3\frac{c_2}{c_0} & 1+l_3\frac{c_3}{c_0} \end{bmatrix} \qquad \text{[Formula 2]}$$

where $l_1$ to $l_3$ and $c_0$ to $c_3$ are coefficients, and
assuming that a first-pixel value that is originally present at each pixel position of the n pieces of first polarized image data is $x_0$ and
three second-pixel values generated by the demosaicing process at the pixel position are $x_{1demo}$, $x_{2demo}$, and $x_{3demo}$, respectively,
the processor calculates three pixel values ($x_{1r}$, $x_{2r}$, and $x_{3r}$) generated at the pixel position for generating four or less pieces of second polarized image data by the following equation $$\begin{Bmatrix} x_{1r} \\ x_{2r} \\ x_{3r} \end{Bmatrix} = \begin{bmatrix} l_1 & 1+l_1\frac{c_1}{c_0} & l_1\frac{c_2}{c_0} & l_1\frac{c_3}{c_0} \\ l_2 & l_2\frac{c_1}{c_0} & 1+l_2\frac{c_2}{c_0} & l_2\frac{c_3}{c_0} \\ l_3 & l_3\frac{c_1}{c_0} & l_3\frac{c_2}{c_0} & 1+l_3\frac{c_3}{c_0} \end{bmatrix} \begin{Bmatrix} x_0 \\ x_{1demo} \\ x_{2demo} \\ x_{3demo} \end{Bmatrix}. \qquad \text{[Formula 3]}$$

4. The image processing device according to claim 3, wherein assuming that four pieces of polarization information of adjacent pixels obtained in a case where non-polarized light having a uniform light amount distribution is incident on the imaging element are $x_0$ to $x_3$, the coefficients $c_0$ to $c_3$ and the pieces of polarization information $x_0$ to $x_3$ satisfy the following equation $$\sum_{i=0}^{3} c_i x_i = 0. \qquad \text{[Formula 4]}$$

5. The image processing device according to claim 3, wherein assuming that a parameter i is set to 1 to 3, the coefficients $I_1$, $I_2$, and $I_3$ in a matrix represented by the [Formula 2] are represented by li, and the coefficients $c_1$, $c_2$, and $c_3$ are represented by the li is represented by the following equation $$l_i = -\frac{C_0^T \tilde{B}_{i,0} C_i}{C_0^T \tilde{B}_{0,0} C_0} \qquad \text{[Formula 10]}$$

$c_i \in \mathbb{R}^3$ : three-element vector obtained
    by removing $(i+i)$th component of $\{c_0, c_1, c_2, c_3\}^T$
$A \in \mathbb{R}^{n \times 4}$ : matrix that applies convesion from four pieces
    of polarization information to another $n$ physical quantities
$B_{i,j} \in \mathbb{R}^{3 \times 3}$ : matrix of 3 rows and 3 columns obtained
    by removing $(i+1)$th row and $(j+1)$th column of $A^T A$
$\sim$ : cofactor matrix where assuming that a matrix A is a matrix of m rows and 4 columns that gives conversion from four pieces of polarization information acquired from the imaging element to other four physical quantities, a matrix B in the equation [Formula 10] is a cofactor matrix of the matrix B of 3 rows and 3 columns obtained by removing (i+1)th row and (j+1)th column of ATA.

6. The image processing device according to claim 5, wherein the matrix A is a unit matrix of 4 rows and 4 columns.

7. An imaging device comprising:
an imaging optical system with a pupil region divided into a first pupil region, a second pupil region, and a third pupil region including three second-polarizers that polarize light passing through the first pupil region, the second pupil region, and the third pupil region in different directions, and
three wavelength selection elements that each pass the light in different wavelength bands from the first pupil region, the second pupil region, and the third pupil region;
an imaging element in which four first-polarizers each having different polarization directions are regularly provided on a plurality of pixels consisting of photoelectric conversion elements arranged in a two-dimensional manner; and
the image processing device according to claim 5, wherein the processor acquires the first image data from the imaging element, and
the matrix A is an interference elimination matrix in a case where three pieces of image data, corresponding to light in each of three wavelength bands from which interference of light in each of three wavelength bands is eliminated from the first image data, are calculated.

8. The image processing device according to claim 3, wherein assuming that a parameter i is set to 1 to 3, the coefficients $l_1$, $l_2$, and $l_3$ in a matrix represented by the [Formula 2] are $l_i$, and the coefficients $c_1$, $c_2$, and $c_3$ are the is represented by the following equation $$\ell_i = -\frac{c_0 c_i}{c_1^2 + c_2^2 + c_3^2} \quad \text{[Formula 18]}$$

9. An imaging device comprising:
an imaging optical system;
an imaging element in which n first-polarizers each having different polarization directions are regularly provided in a plurality of pixels consisting of photoelectric conversion elements arranged in a two-dimensional manner, assuming that n is an integer of 4 or more; and
the image processing device according to claim 1,
wherein the processor acquires first image data from the imaging element.

10. An image processing method using a processor and a memory that stores a relationship between polarization directions, the method comprising:
acquiring, by the processor, first image data from an imaging element in which n first-polarizers having different polarization directions are regularly provided in a plurality of pixels consisting of photoelectric conversion elements arranged in a two-dimensional manner, assuming that n is an integer of 4 or more;
performing, by the processor, a demosaicing process on the first image data to generate n pieces of first polarized image data having different polarization directions; and
generating, by the processor, n or less pieces of second polarized image data by using the n pieces of first polarized image data and the relationship between the polarization directions stored in the memory,
wherein in a case where the n is 4,
assuming that four pieces of polarized image data separated from the first image data for each polarization direction are $I_1$, $I_2$, $I_3$, and $I_4$, respectively, the processor performs calculation of the following equation $$\begin{Bmatrix} I_1 \\ I_2 \\ I_3 \\ I_4 \end{Bmatrix} * K \quad \text{[Formula 1]}$$

however, $$K = k \otimes k$$

$$k = \begin{Bmatrix} 0.125a \\ 0 \\ 0.5 - 0.125a \\ 1 \\ 0.5 - 0.125a \\ 0 \\ 0.125a \end{Bmatrix}$$

where a is a parameter,
to generate four pieces of first polarized image data subjected to the demosaicing process.

11. A non-transitory, computer-readable tangible recording medium which records thereon a program for causing, when read by a computer, the computer to execute the image processing method according to claim 10.

12. An image processing device comprising:
a processor; and
a memory that stores a relationship between polarization directions,
wherein the processor performs image processing, and performs
an acquisition process of acquiring first image data from an imaging element in which n first-polarizers having different polarization directions are regularly provided in a plurality of pixels consisting of photoelectric conversion elements arranged in a two-dimensional manner, assuming that n is an integer of 4 or more,
a first polarized image data generation process of performing a demosaicing process on the first image data to generate n pieces of first polarized image data according to the different polarization directions, and
a second polarized image data generation process of generating n or less pieces of second polarized image data by using the n pieces of first polarized image data and the relationship between the polarization directions stored in the memory,
wherein in a case where the n is 4,
the memory stores,
as the relationship between the polarization directions of the n first-polarizers, the following matrix $$\begin{bmatrix} l_1 & 1+l_1\frac{c_1}{c_0} & l_1\frac{c_2}{c_0} & l_1\frac{c_3}{c_0} \\ l_2 & l_2\frac{c_1}{c_0} & 1+l_2\frac{c_2}{c_0} & l_2\frac{c_3}{c_0} \\ l_3 & l_3\frac{c_1}{c_0} & l_3\frac{c_2}{c_0} & 1+l_3\frac{c_3}{c_0} \end{bmatrix} \quad \text{[Formula 2]}$$

where $l_1$ to $l_3$ and $c_0$ to $c_3$ are coefficients, and
assuming that a first-pixel value that is originally present at each pixel position of the n pieces of first polarized image data is $x_0$ and
three second-pixel values generated by the demosaicing process at the pixel position are $x_{1demo}$, $x_{2demo}$, and $x_{3demo}$, respectively,
the processor calculates three pixel values ($x_{1r}$, $x_{2r}$, and $x_{3r}$) generated at the pixel position for generating four or less pieces of second polarized image data by the following equation $$\begin{Bmatrix} x_{1r} \\ x_{2r} \\ x_{3r} \end{Bmatrix} = \begin{bmatrix} l_1 & 1+l_1\frac{c_1}{c_0} & l_1\frac{c_2}{c_0} & l_1\frac{c_3}{c_0} \\ l_2 & l_2\frac{c_1}{c_0} & 1+l_2\frac{c_2}{c_0} & l_2\frac{c_3}{c_0} \\ l_3 & l_3\frac{c_1}{c_0} & l_3\frac{c_2}{c_0} & 1+l_3\frac{c_3}{c_0} \end{bmatrix} \begin{Bmatrix} x_0 \\ x_{1demo} \\ x_{2demo} \\ x_{3demo} \end{Bmatrix}$$

\* \* \* \* \*